(12) United States Patent
Huang

(10) Patent No.: US 12,641,774 B2
(45) Date of Patent: May 26, 2026

(54) MEMORY CELL WITH IMPROVED INSULATING STRUCTURE AND METHOD OF MANUFACTURING THEREOF

(71) Applicant: NANYA TECHNOLOGY CORPORATION, New Taipei City (TW)

(72) Inventor: Chung-Lin Huang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 480 days.

(21) Appl. No.: 18/379,866

(22) Filed: Oct. 13, 2023

(65) Prior Publication Data

US 2024/0206156 A1     Jun. 20, 2024

Related U.S. Application Data

(62) Division of application No. 18/083,921, filed on Dec. 19, 2022, now Pat. No. 12,484,215.

(51) Int. Cl.
H10B 12/00          (2023.01)
(52) U.S. Cl.
CPC ........... H10B 12/34 (2023.02); H10B 12/053 (2023.02)
(58) Field of Classification Search
CPC ...... H10B 12/03; H10B 12/053; H10B 12/09; H10B 12/31; H10B 12/34; H10B 12/39; H10B 41/30
See application file for complete search history.

(56) References Cited

U.S. PATENT DOCUMENTS

| | | | | |
|---|---|---|---|---|
| 2019/0027480 A1* | 1/2019 | Lee | ...................... | H10B 12/053 |
| 2019/0259839 A1* | 8/2019 | Ryu | ...................... | H10D 62/156 |
| 2020/0105765 A1 | 4/2020 | Kim et al. | | |

FOREIGN PATENT DOCUMENTS

| | | |
|---|---|---|
| TW | 200419729 A | 10/2004 |
| TW | 200514093 A | 4/2005 |
| TW | 200729391 A | 8/2007 |
| TW | 200905810 A | 2/2009 |
| TW | 201036042 A | 10/2010 |
| TW | 201409668 A | 3/2014 |
| TW | 201813058 A | 4/2018 |
| TW | 202032790 A | 9/2020 |

OTHER PUBLICATIONS

Office Action and and the search report mailed on Feb. 1, 2024 related to Taiwanese Application No. 112117529.

(Continued)

*Primary Examiner* — Hoai V Pham
(74) *Attorney, Agent, or Firm* — Xuan Zhang

(57)          ABSTRACT

The present disclosure provides a memory device and a method of manufacturing the same. The memory device includes a substrate, a first gate electrode arranged within the substrate, a second gate electrode arranged within the substrate and over the first gate electrode, and an electrical insulating structure separating the substrate, the first gate electrode and the second gate electrode from one another. The memory device further includes a first dielectric layer arranged within the substrate and covering an upper portion of the electrical insulating structure from a top-view perspective.

15 Claims, 22 Drawing Sheets

(56)             References Cited

OTHER PUBLICATIONS

Office Action and and the search report mailed on Mar. 8, 2024 related to Taiwanese Application No. 113103363.
Office Action and and the search report mailed on Jun. 24, 2024 related to Taiwanese Application No. 112117529.
Office Action and and the search report mailed on May 23, 2024 related to Taiwanese Application No. 113103363.
Office Action and and the search report mailed on Aug. 12, 2025 related to U.S. Appl. No. 18/083,921, wherein this application is a DIV of U.S. Appl. No. 18/083,921.

* cited by examiner

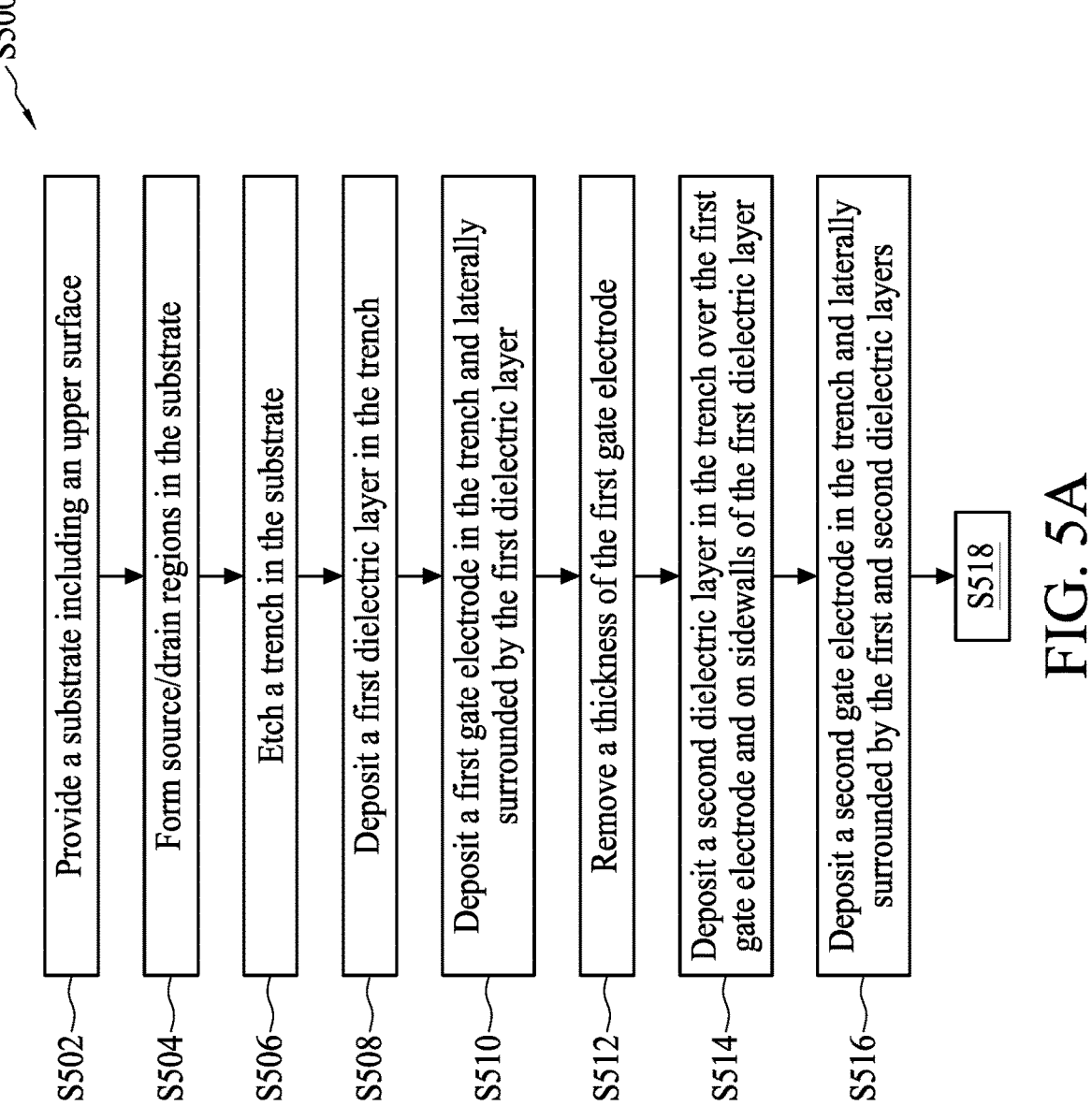

S500

S502 — Provide a substrate including an upper surface

S504 — Form source/drain regions in the substrate

S506 — Etch a trench in the substrate

S508 — Deposit a first dielectric layer in the trench

S510 — Deposit a first gate electrode in the trench and laterally surrounded by the first dielectric layer S512 — Remove a thickness of the first gate electrode S514 — Deposit a second dielectric layer in the trench over the first gate electrode and on sidewalls of the first dielectric layer S516 — Deposit a second gate electrode in the trench and laterally surrounded by the first and second dielectric layers

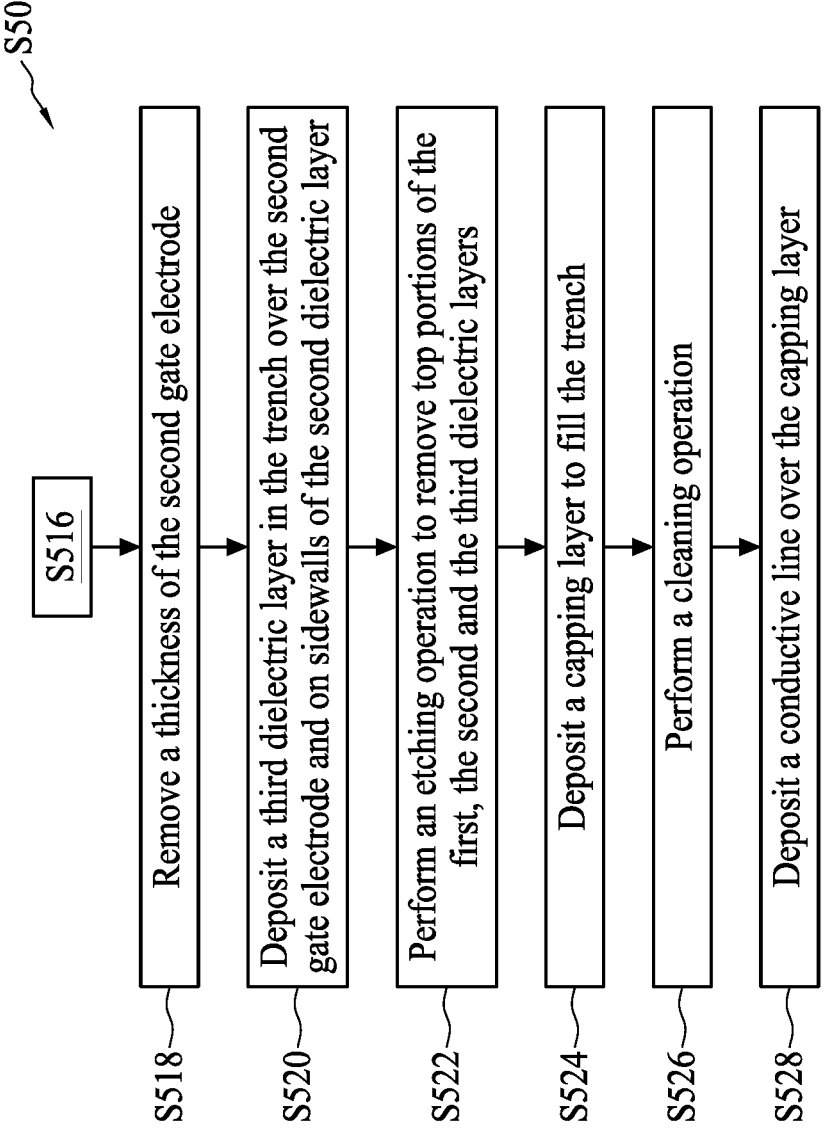

S500

S516

S518 — Remove a thickness of the second gate electrode

S520 — Deposit a third dielectric layer in the trench over the second gate electrode and on sidewalls of the second dielectric layer S522 — Perform an etching operation to remove top portions of the first, the second and the third dielectric layers S524 — Deposit a capping layer to fill the trench S526 — Perform a cleaning operation S528 — Deposit a conductive line over the capping layer

FIG. 5B

MEMORY CELL WITH IMPROVED INSULATING STRUCTURE AND METHOD OF MANUFACTURING THEREOF

CROSS-REFERENCE TO RELATED APPLICATION

This application is a divisional application of U.S. Non-Provisional application Ser. No. 18/083,921 filed Dec. 19, 2022, which is incorporated herein by reference in its entirety.

TECHNICAL FIELD

The present disclosure relates to a memory cell and a method of manufacturing the memory cell. Particularly, the memory cell includes an improved insulation structure for electrically insulated the memory cells from each other.

DISCUSSION OF THE BACKGROUND

As the semiconductor industry has progressed into advanced technology nodes in pursuit of greater device performance and a higher device density, it has reached an advanced precision of photolithography. In order to further reduce device sizes, dimensions of elements and distances between different elements have to be proportionally reduced. However, with the reductions in the dimensions of the elements and the distances between different elements, challenges of precise control of the dimensions and the distances have arisen.

Memory devices, such as dynamic random access memory (DRAM) or static RAM (SRAM), have been widely adopted in the modern semiconductor applications. Among the issues of developing the memory device with smaller device size and greater functionality, leakage current in a control transistor of a memory cell is a challenging problem. Therefore, there is a need to develop an improved structure of the memory cells for effectively reducing the leakage current and saving more power of the memory device.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a memory device. The memory device includes: a substrate; a first gate electrode arranged within the substrate; and a second gate electrode arranged within the substrate and over the first gate electrode. The memory device further includes an electrical insulating structure separating the substrate, the first gate electrode and the second gate electrode from one another; and a first dielectric layer arranged within the substrate and covering an upper portion of the electrical insulating structure from a top-view perspective.

According to some embodiments of the present disclosure, the electrical insulating structure includes a first insulating layer lining a sidewall of the substrate.

According to some embodiments of the present disclosure, the electrical insulating structure further includes a second insulating layer arranged over the first gate electrode and laterally surrounded by the first insulating layer.

According to some embodiments of the present disclosure, the electrical insulating structure further includes a third insulating layer arranged over the second gate electrode and laterally surrounded by the second insulating layer.

According to some embodiments of the present disclosure, the third insulating layer has a top portion lower than a top portion of the second insulating layer, and the top portion of the second insulating layer is lower than a top portion of the first insulating layer.

According to some embodiments of the present disclosure, the third insulating layer has an outer sidewall aligned with a sidewall of the second gate electrode.

According to some embodiments of the present disclosure, the upper portion of the electrical insulating structure has a slope extending from the substrate to the second gate electrode.

According to some embodiments of the present disclosure, the upper portion of the electrical insulating structure is lower than an upper surface of the substrate.

According to some embodiments of the present disclosure, the memory device further includes a second dielectric layer arranged over the substrate and laterally surrounding the first dielectric layer.

According to some embodiments of the present disclosure, the first dielectric layer includes an upper surface level with a top surface of the second dielectric layer.

One aspect of the present disclosure provides a memory device. The memory device includes: a substrate; a first gate electrode arranged within the substrate; a capping layer arranged within the substrate and over the first gate electrode; and a first dielectric layer arranged beneath a bottom surface of the first gate electrode and laterally surrounding the first gate electrode and the capping layer. The memory device further includes a second dielectric layer laterally surrounding the capping layer and laterally surrounded by the first dielectric layer, wherein the first dielectric layer has a first top portion higher than a second top portion of the second dielectric layer.

According to some embodiments of the present disclosure, the memory device further includes a second gate electrode arranged in the substrate between the first dielectric layer and the second dielectric layer.

According to some embodiments of the present disclosure, the second dielectric layer includes a sidewall aligned with a sidewall of the second gate electrode.

According to some embodiments of the present disclosure, wherein the first dielectric layer and the second dielectric layer are formed of a same material.

According to some embodiments of the present disclosure, the memory device further includes a third dielectric layer laterally surrounding the capping layer and laterally surrounded by the second dielectric layer, and the third dielectric layer is formed of a material different from the capping layer.

According to some embodiments of the present disclosure, the memory device further includes a conductive line extending over the capping layer and separated from the third dielectric layer by the capping layer.

According to some embodiments of the present disclosure, the memory device further includes a doped region disposed in the substrate on one side of the first gate electrode.

According to some embodiments of the present disclosure, the memory device further includes a mask layer over an upper surface of the substrate and laterally surrounding the capping layer.

According to some embodiments of the present disclosure, the capping layer includes an upper portion with a substantially uniform width.

According to some embodiments of the present disclosure, the capping layer further comprises a middle portion below the upper portion, the middle portion tapering from a first location around a top portion of the third dielectric layer to a second location directly above the first gate electrode.

One aspect of the present disclosure provides a method of manufacturing a memory device. The method includes: providing a substrate including an upper surface; performing a first etching operation to form a trench in the substrate; depositing a first dielectric layer in the trench; forming a first gate electrode in the trench and laterally surrounded by the first dielectric layer; depositing a second dielectric layer in the trench over the first gate electrode and on sidewalls of the first dielectric layer; performing a second etching operation to remove top portions of the first and second dielectric layers; and depositing a capping layer to fill the trench.

According to some embodiments of the present disclosure, the second etching operation includes an anisotropic etching operation.

According to some embodiments of the present disclosure, the anisotropic etching operation includes a dry etching operation.

According to some embodiments of the present disclosure, the method further includes depositing a second gate electrode in the trench and laterally surrounded by the second dielectric layer.

According to some embodiments of the present disclosure, the first gate electrode and the second gate electrode are formed of different materials.

According to some embodiments of the present disclosure, the method further includes removing a thickness of the second gate electrode.

According to some embodiments of the present disclosure, the method further includes depositing a third dielectric layer in the trench and over the second gate electrode.

According to some embodiments of the present disclosure, the second etching operation further removes a portion of the third dielectric layer covering the second gate electrode.

According to some embodiments of the present disclosure, the second etching operation forms a slope on the second and the third dielectric layers and causes a top portion of the third dielectric layer to be lower than a top portion of the second dielectric layer.

According to some embodiments of the present disclosure, the second etching operation causes the slope to extend to the first dielectric layer and causes the top portion of the second dielectric layer to be lower than a top portion of the first dielectric layer.

According to some embodiments of the present disclosure, the second etching operation causes the top portions of the first and second dielectric layers to be lower than the upper surface of the substrate.

According to some embodiments of the present disclosure, the depositing of the first dielectric layer and the second dielectric layer comprises depositing the first and second dielectric layers in a conformal manner along a sidewall of the trench.

According to some embodiments of the present disclosure, the capping layer includes a middle portion tapering from a first location around a top portion of the first dielectric layer after the second etching operation to a second location directly over the second dielectric layer; and a lower portion below the middle portion, wherein the lower portion has a substantially uniform width.

According to some embodiments of the present disclosure, the method further includes forming source/drain regions in the substrate prior to the first etching operation.

According to some embodiments of the present disclosure, the first and second dielectric layers are formed of a material different from the capping layer.

Through the recessed upper portion of the electrical insulating structure, the electrical insulating structure can be better protected by the overlying capping layer or the dielectric layer. The bit line stringers otherwise formed between the adjacent word lines may be prevented from occurring. As a result, the electrical insulation between the memory cells can be maintained, and the device reliability can be improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIGS. 5A and 5B show a schematic flowchart of a method of manufacturing a memory cell, in accordance with some embodiments of the present disclosure.

DETAILED DESCRIPTION

Figure 1A:
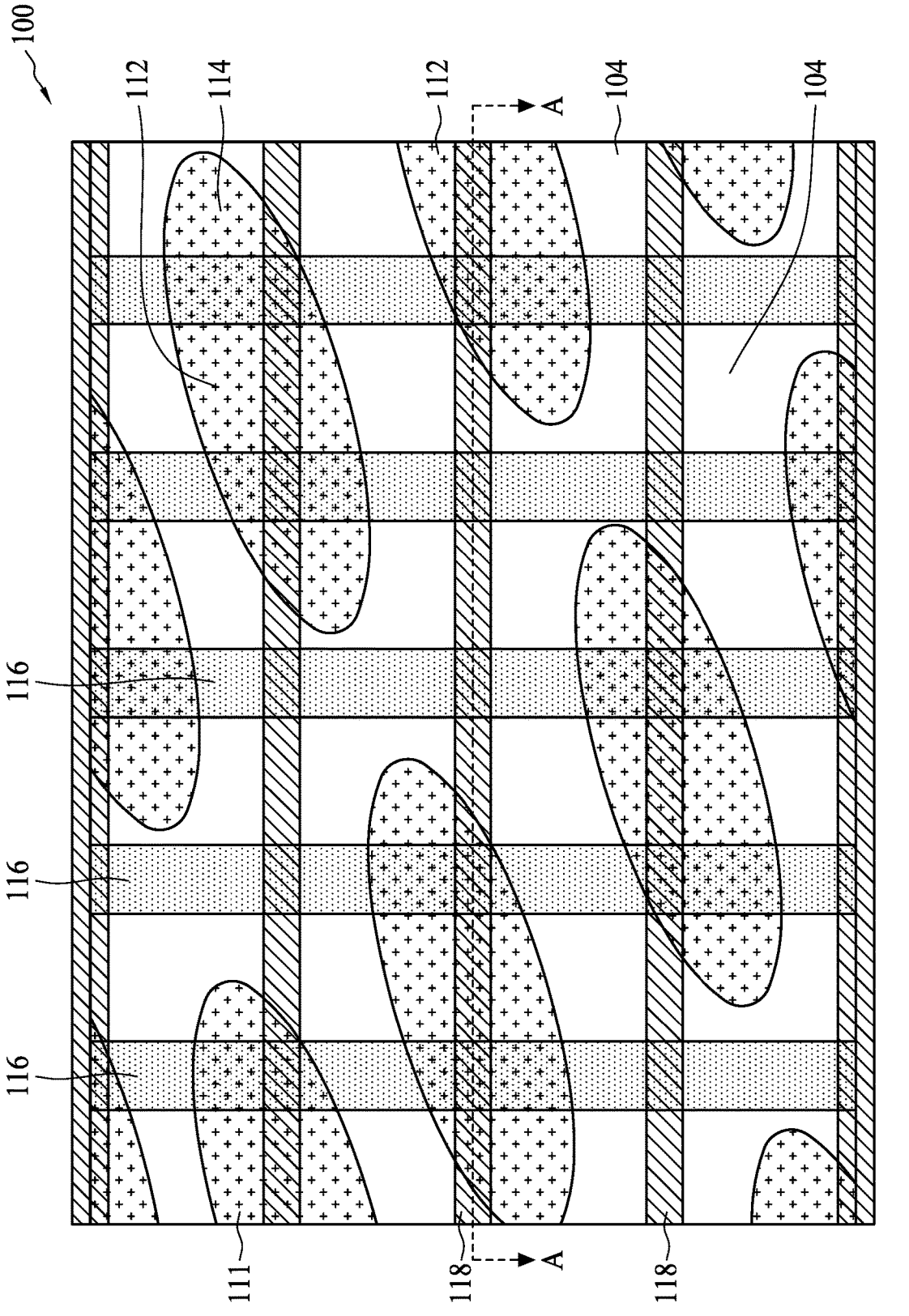
FIGS. 1A and 1B are a top view and a cross-sectional view, respectively, of a memory array, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "couple" or "connect" used throughout the present disclosure refers to physical or electrical linkage between two or more objects. These objects may also be referred to as being "coupled" or "connected" through exchange of data or information. These "coupled" or "connected" objects may be in direct contact in some cases or indirect contact through other intervening objects.

Embodiments of the present disclosure discuss a memory array formed of a plurality of memory cells and a method of forming a memory array. Among the various types of the memory devices, dynamic random access memory (DRAM) has drawn a lot of acceptance and applications in a pyramid of modern electronic devices for its low cost and good access efficiency. According to some embodiments of the present disclosure, a dual-work-function gate electrode framework, or alternatively, a dual-electrode-gates framework, is adopted for forming the word line (or equivalently the gate electrode) of each of the memory cells to improve the electrical performance of the memory cells. However, during the manufacturing process of the memory array with the dual-work-function word line, an electrical insulating structure may be inadvertently damaged by the chemistry used in the cleaning operation. As a result, undesired short circuit may result from a conductive stringer formed in the damage portion of the electrical insulating structure. The reliability of the memory array may deteriorate accordingly.

To address the abovementioned issues, a method of trimming the electrical insulating structure is proposed. Through an appropriate trimming or recessing approach on the electrical insulating structure followed by a formation of a capping layer to cover the electrical insulating structure, the trimmed or recessed electrical insulating structure can be protected from unnecessary damage during the subsequent operations. Thus, the dual-work-function word line scheme can operate efficiently and reliably.

Figure 1B:
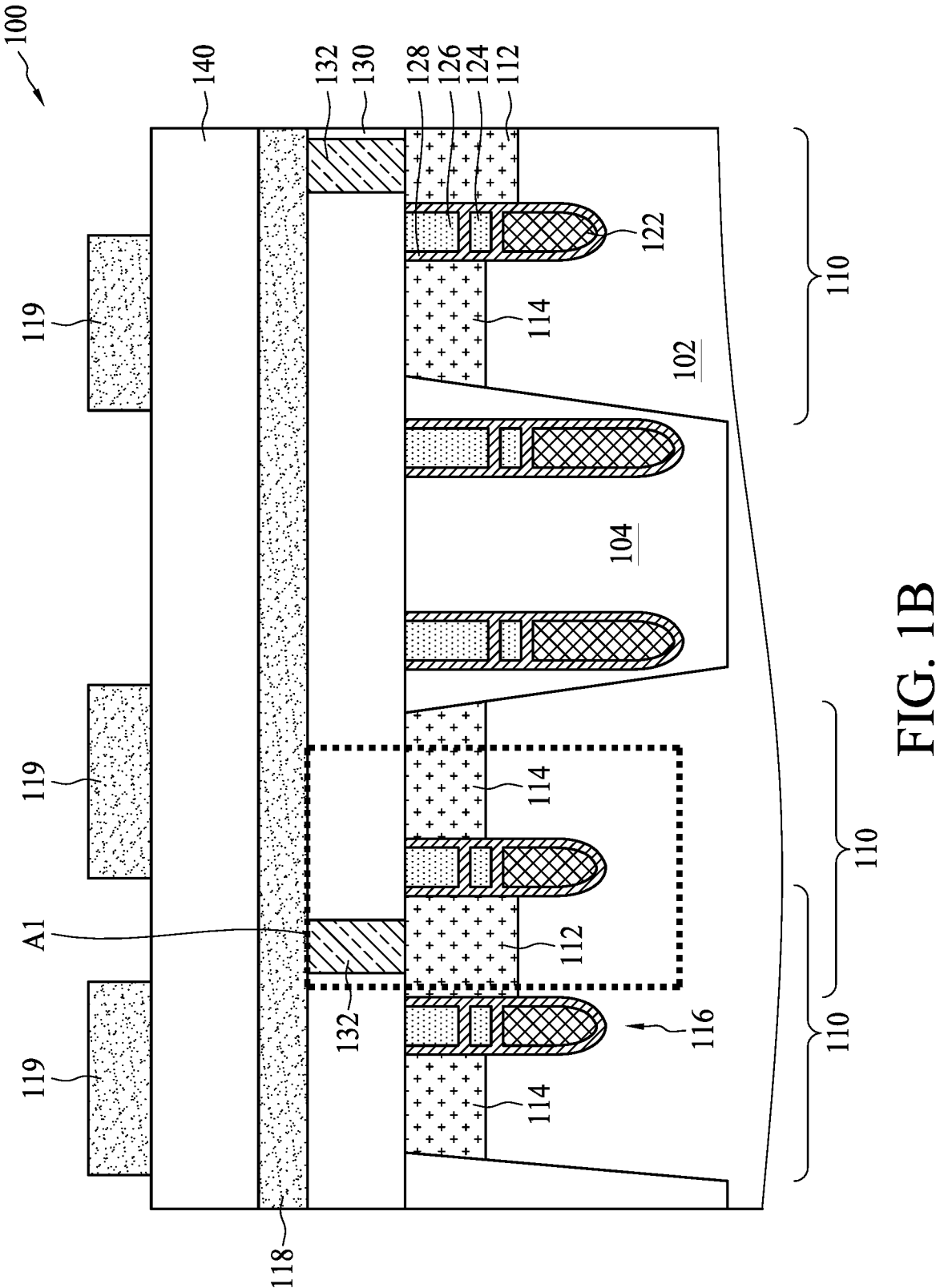

FIGS. 1A and 1B are a top view and a cross-sectional view, respectively, of a memory array 100, in accordance with some embodiments of the present disclosure. The cross-sectional view is taken along a sectional line AA in FIG. 1A. In some embodiments, the memory array 100 is formed of DRAM cells. A DRAM cell, e.g., represented by a memory cell 110 shown in FIG. 1B, is generally formed of a memory unit (not separately shown) configured to store the data information and a control unit configured to perform the access operations on the memory unit, such as a read operation and a write operation. The control unit is usually implemented by a transistor, e.g., field-effect transistor (FET), such as metal-oxide semiconductor (MOS) FET (MOSFET). According to different architectures of the transistors, the control unit of the DRAM can be formed of a planar FET. However, other types of FET, e.g., a fin-type FET (FinFET), a gate-all-around (GAA) FET, nanosheet FET, nanowire FET, or the like, are also within the contemplated scope of the present disclosure.

Referring to FIGS. 1A and 1B, the memory array 100 includes a plurality of control units, in which each control unit includes an active region 111 formed in a substrate 102. The plurality of active regions 111 are arranged parallel to each other from a top-view perspective. In some embodiments, the active regions 111 have an oval or ellipse shape from a top-view perspective. The active regions 111 are formed to include source/drain region therein for each control unit. According to some embodiments of the present disclosure, the memory array 100 further includes isolation regions 104 defining and electrically separating the active regions 111. In some embodiments, the isolation regions 104 are formed of a dielectric material, such as silicon oxide, silicon nitride, silicon carbide, silicon oxynitride, or other suitable dielectric materials.

According to some embodiments of the present disclosure, the memory array 100 also includes a plurality of word lines 116 extending in the substrate 102. The word lines 116 may cross the active regions 111, in which the gate electrode 122 (part of the word line 116) and the source/drain regions on two sides of the respective word line 116 collectively form a transistor or a control unit of a memory cell 110. According to some embodiments of the present disclosure, the memory array further include a plurality of bit lines 118 extending over the substrate 102. The bit lines 118 are electrically coupled to one of the source/drain regions 112 of the respective transistor. Similarly, the memory array 100 may include a plurality of source lines (not separately shown in FIG. 1A, but illustrated in FIG. 1B as reference 119) over the substrate 102 to be electrically coupled to the other source/drain region 114 of the same transistor. According to some embodiments of the present disclosure, an angle is formed between the word lines 116 and the active regions 111 from a top-view perspective, in which the angle is not a right angle to increase the routing efficiency of the word lines 116, the bit lines 118 and the source lines 119.

According to some embodiments of the present disclosure, referring to FIG. 1B, two word lines 116 are enclosed by the isolation region 104, and are also referred to as passing word lines 116. The passing word lines 116 are configured as non-functional word lines 116, and are electrically isolated from other features of the memory array 100 by the intervening isolation regions 104. According to some embodiments of the present disclosure, the other three example word lines 116 not enclosed by the isolation regions 104 are formed in the active regions 111 and disposed immediately adjacent to the respective source/drain regions 112 and 114. Therefore, these word lines 116 are also referred to as active word lines 116. The active word lines 116 are configured as functional word lines 116 and serve as gate electrodes of the transistors for the respective memory cells 110.

According to some embodiments of the present disclosure, a first dielectric layer 130 and a second dielectric layer 140 are successively formed over the substrate 102. In some embodiments, the first dielectric layer 130 and the second dielectric layer 140 each are formed of a dielectric material, such as silicon oxide, silicon nitride, silicon oxynitride, silicon carbide, or the like. In some embodiments, each of the first dielectric layer 130 and the second dielectric layer 140 includes a monolayer structure or a multilayer structure. According to some embodiments of the present disclosure, conductive vias 132 are formed through the first dielectric layer 130 and electrically coupling the source/drain region 112 to the corresponding bit lines 118. According to some embodiments of the present disclosure, conductive vias (not separately shown) are formed through the first dielectric layer 130 and the second dielectric layer 140, and electrically couple the source/drain region 114 to the corresponding source lines 119. Although not separately shown, the memory array 100 may include a plurality of conductive vias formed within the first dielectric layer 130 or the second dielectric layer 140 to electrically couple the gate electrodes of the word lines 116 to corresponding biasing voltage sources.

According to some embodiments of the present disclosure, the bit lines 118, source lines 119 and conductive vias 132 are formed of conductive materials, such as tungsten, aluminum, titanium, tantalum, gold, silver, copper, alloys thereof, or the like. According to some embodiments of the present disclosure, the bit lines 118, source lines 119, conductive vias 132 and 134 are formed using lithography and deposition operations. According to some embodiments of the present disclosure, the deposition operations may include chemical vapor deposition (CVD), physical vapor deposition (PVD), atomic layer deposition (ALD), or other suitable deposition methods.

According to some embodiments of the present disclosure, each of the word lines 116 is formed of a first gate electrode 122, a second gate electrode 124, a capping layer 126 and an electrical insulating structure 128. In some embodiments, the electrically insulating structure 128 is configured to electrically insulate the first gate electrode 122 from the second gate electrode 124, and electrically insulate the first gate electrode 122 and the second gate electrode 124 from the other features of the memory array 100. In some embodiments, the first gate electrode 122 and the second gate electrode 124 are formed of different materials to provide different work functions, e.g., the first gate electrode 122 is formed of a metal gate and comprised of one or more metallic materials, while the second gate electrode 124 is formed of doped polysilicon. The gate electrodes 122 and 124 with different work functions may lead to different electric field distributions around thereof in the vicinity of the word lines 116 during an access operation, and the leakage level, e.g., an effect known as the gate-induced device leakage (GIDL), can be controlled better while the device speed can be maintained. In some embodiments, one of the first gate electrode 122 and the second gate electrode 124 is omitted from the word line 116, and thus only a single-work-function gate electrode is used in the word line 116.

Figure 2:
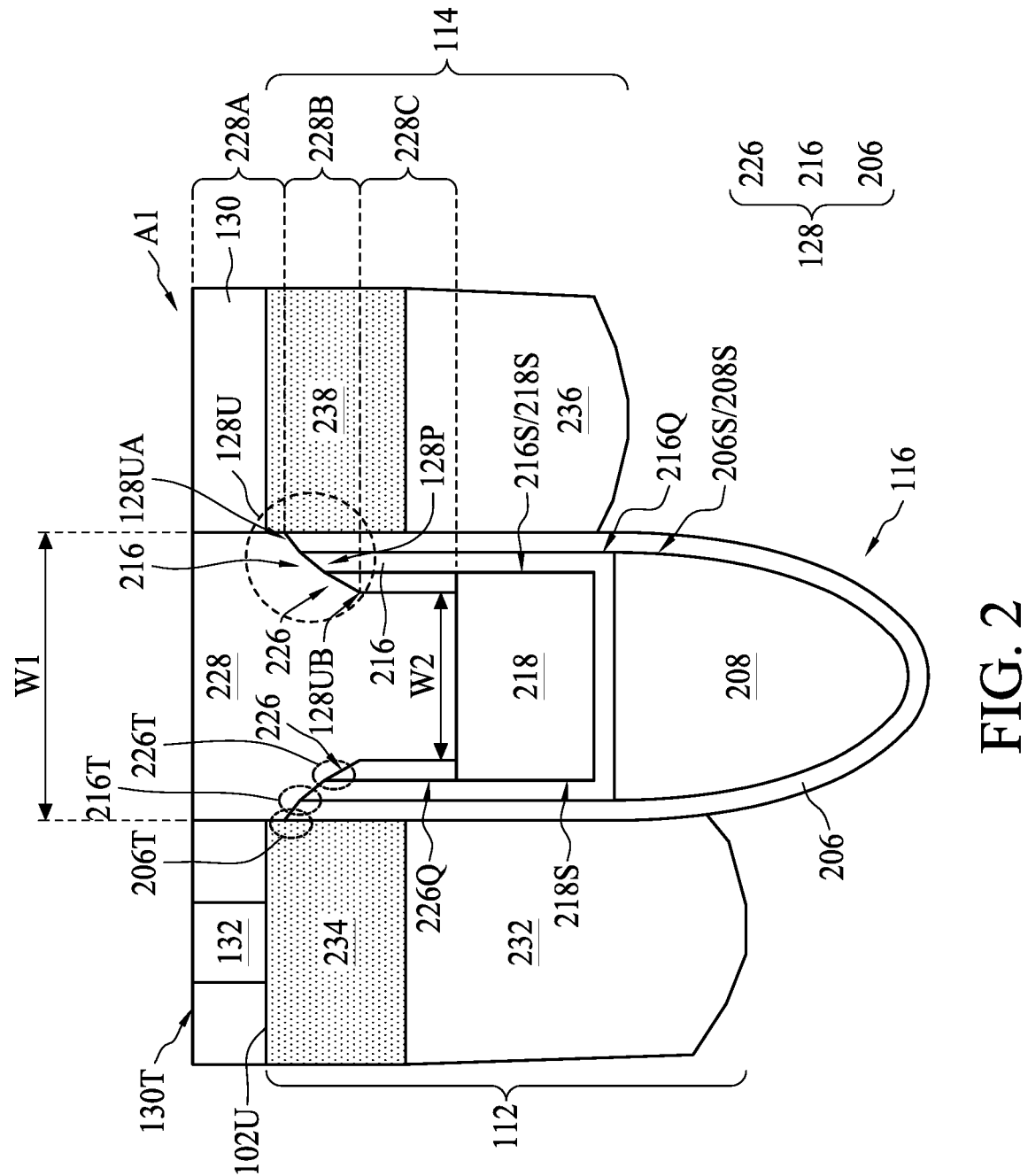
FIG. 2 is an enlarged view of a portion of the memory array shown in FIG. 1A, in accordance with some embodiments of the present disclosure.

FIG. 2 is an enlarged view of a portion A1 of the memory array 100 shown in FIG. 1A, in accordance with some embodiments of the present disclosure. Referring to FIG. 2, the portion A1 illustrate a memory cell 110 (excluding the memory unit), including the word line (gate electrode) 116 and the source/drain regions 112, 114. According to some embodiments of the present disclosure, the electrical insulating structure 128 is formed of a first insulating layer 206, a second insulating layer 216 and a third insulating layer 226, which also are referred to herein a first dielectric layer 206, a second dielectric layer 216 and a third dielectric layer 226, respectively. According to some embodiments of the present disclosure, at least one or more of the first dielectric layer 206, the second dielectric layer 216 and the third dielectric layer 226 are configured as the gate dielectric layer of the transistor of the memory cell 110. In some embodiments, the first dielectric layer 206, the second dielectric layer 216 and the third dielectric layer 226 are formed of the same dielectric material, e.g., silicon dioxide. In some embodiments, the first dielectric layer 206, a second dielectric layer 216 and a third dielectric layer 226 are formed in a conformal manner. As a result, a channel is formed in the substrate 102 between the source/drain region 112 and the source/drain region 114 along the lower portion of the first dielectric layer 206, in which carriers are moved by the electric fields generated by the first gate electrode 208 and the second gate electrode 218. In some embodiments, the total electrical field around the channel of the memory cell 110 is formed collectively by the first gate electrode 208 and the second gate electrode 218 with different work functions.

According to some embodiments of the present disclosure, the source/drain region 112 is formed of a first doped region 232 and a second doped region 234. In some embodiments, the first doped region 232 or the second doped region 234 is doped with a dopant conductivity different from that of the substrate 102, e.g., the substrate 102 may be doped with P-type dopants, such as boron, gallium or the like, while the first doped region 232 or the second doped region 234 is doped with N-type dopants, such as phosphorus, arsenic, or the like. In some embodiments, the first doped region 232 has a doping concentration less than that of the second doped region 234. For example, the first doped region 232 has a doping concentration in a range between about 1E12 and about 1E13 atoms/cm³, while the second doped region 234 has a doping concentration in range between about 1E14 and about 1E15 atoms/cm³.

According to some embodiments of the present disclosure, the source/drain region 114 is formed of a first doped region 236 and a second doped region 238. In some embodiments, the first doped region 236 or the second doped region 238 is doped with a dopant conductivity different from that of the substrate 102, e.g., the substrate 102 may be doped with P-type dopants, such as boron, gallium or the like, while the first doped region 236 or the second doped region 238 is doped with N-type dopants, such as phosphorus, arsenic, or the like. In some embodiments, the first doped region 236 has a doping concentration less than that of the second doped region 238. For example, the first doped region 236 has a doping concentration in a range between about 1E12 and about 1E13 atoms/cm³, while the second doped region 238 has a doping concentration in range between about 1E14 and about 1E15 atoms/cm³. According to some embodiments of the present disclosure, the source/drain region 114 has a depth less than the depth of the source/drain region 112.

Referring to FIG. 1B and FIG. 2, two adjacent memory cells 110 between two adjacent passing word lines 116 include two active word lines 116, one source/drain region 112 and two source/drain regions 114. The central source/drain region 112 is shared by the two adjacent memory cells 110, and the device size can be further reduced.

According to some embodiments of the present disclosure, the memory cell 110 includes a capping layer 228 formed over the second gate electrode 218. According to some embodiments of the present disclosure, the capping layer 228 is a dielectric layer formed f a dielectric material different from the first dielectric layer 206, the second dielectric layer 216 and the third dielectric layer 226. For example, the capping layer 228 is formed of silicon nitride. In some embodiments, the capping layer 228 includes an upper portion 228A, a middle portion 228B and a lower portion 228C. According to some embodiments of the present disclosure, the upper portion 228A has a substantially equal width W1 from a cross-sectional view. According to some embodiments of the present disclosure, the lower portion 228C has a substantially equal width W2 from a cross-sectional view. According to some embodiments of the present disclosure, the middle portion 228B tapers from a first location 228UA around a top portion of the first dielectric layer 206 to a second location 228UB directly above the second gate electrode 218 from a cross-sectional view. According to some embodiments of the present disclosure, the first dielectric layer 206 lines a sidewall of the source/drain region 112 or 114 and laterally surrounds the first gate electrode 208. According to some embodiments of the present disclosure, an inner sidewall 206S of the first dielectric layer 206 physically contacts or flushes with a sidewall 208S of the first gate electrode 208.

According to some embodiments of the present disclosure, the second dielectric layer 216 includes an outer sidewall 216Q lining the inner sidewall 206S of the first dielectric layer 206, and laterally surrounds the second gate electrode 218. Further, the second dielectric layer 216 has a lower portion extending beneath the second gate electrode 218. According to some embodiments of the present disclosure, an inner sidewall 216S of the second dielectric layer 216 physically contacts or flushes with a sidewall 218S of the second gate electrode 218.

According to some embodiments of the present disclosure, the third dielectric layer 226 has an outer sidewall 226Q lines the inner sidewall 216S of the second dielectric layer 216 and laterally surrounds a lower portion 228C of the capping layer 228. According to some embodiments of the present disclosure, the outer sidewall 226Q of the third dielectric layer 226 physically contacts or flushes with a sidewall of a lower portion 228C of the capping layer 228.

According to some embodiments of the present disclosure, the capping layer 228 physically contacts the second gate electrode 218. According to some embodiments of the present disclosure, the third dielectric layer 226 rests on an upper surface of the second gate electrode 218.

According to some embodiments of the present disclosure, the first dielectric layer 206, the second dielectric layer 216 and the third dielectric layer 226 of the electrical insulating structure 128 at least partially is lined in a conformal manner along the sidewalls of the source/drain regions 112 or 114. According to some embodiments of the present disclosure, the electrical insulating structure 128 has an upper portion 128U recessed from the upper surface 102U of the substrate 102. In other words, each of the top portions 206T, 216T and 226T of the first dielectric layer 206, the second dielectric layer 216 and the third dielectric layer 226, respectively, is recessed from the upper surface 102U of the substrate 102. According to some embodiments of the present disclosure, the third dielectric layer 226 has a top portion 226T lower than the top portion 216T of the second dielectric layer 216, while the second dielectric layer 216 has a top portion 216T lower than the top portion 206T of the first dielectric layer 206. In some embodiments, the upper surface of the electrical insulating structure 128 has a slope 128P extending from a location near the upper surface 102U of the substrate 102 to the second gate electrode 218. According to some embodiments of the present disclosure, the slope 128P is in a substantially straight line shape. According to some embodiments of the present disclosure, the slope 128P is in a substantially curved shape.

Figure 3A:
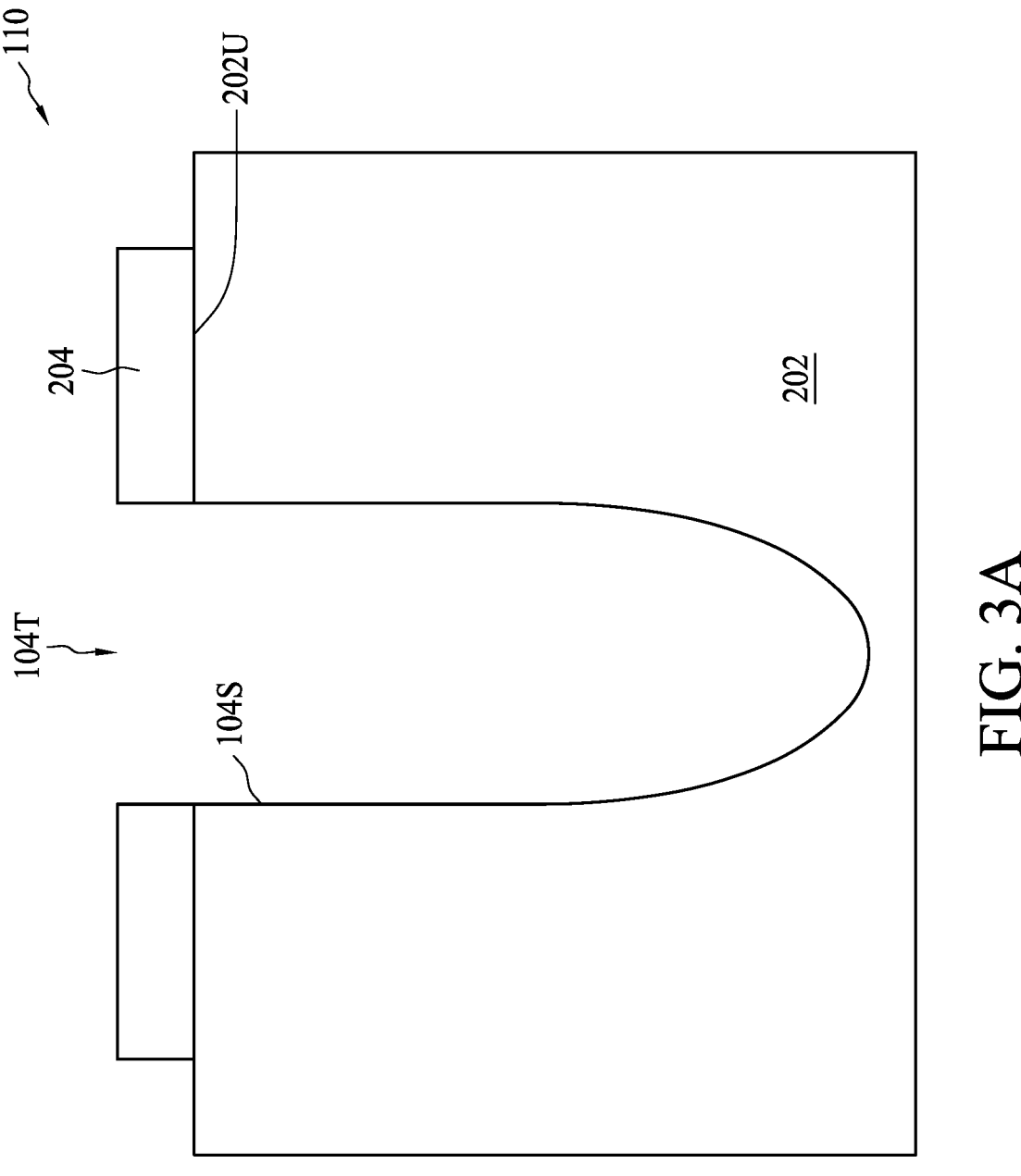
FIGS. 3A to 3N are schematic cross-sectional views of intermediate stages of a method of forming a memory device shown in FIG. 2, in accordance with some embodiments of the present disclosure.
Figure 3B:
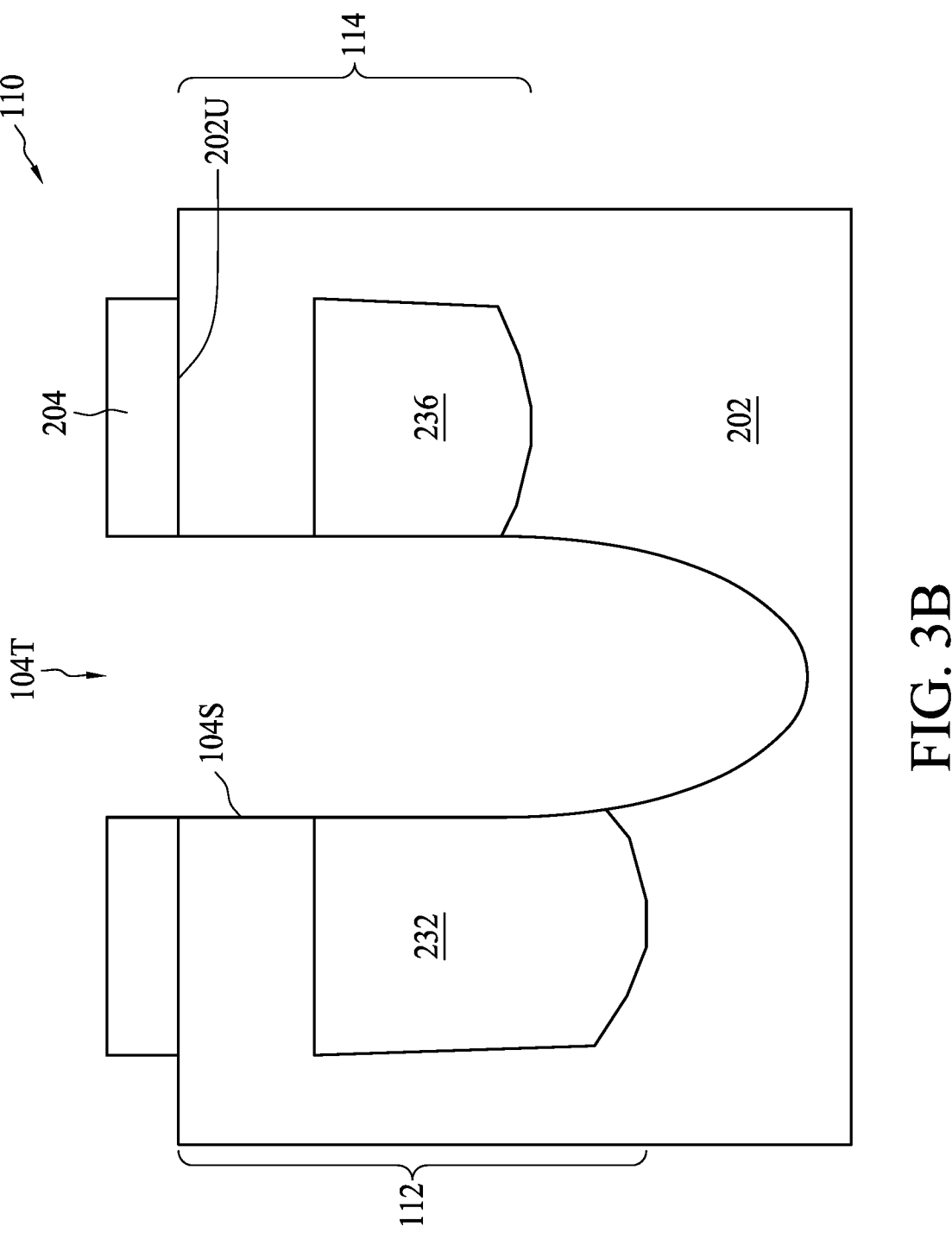
Figure 3C:
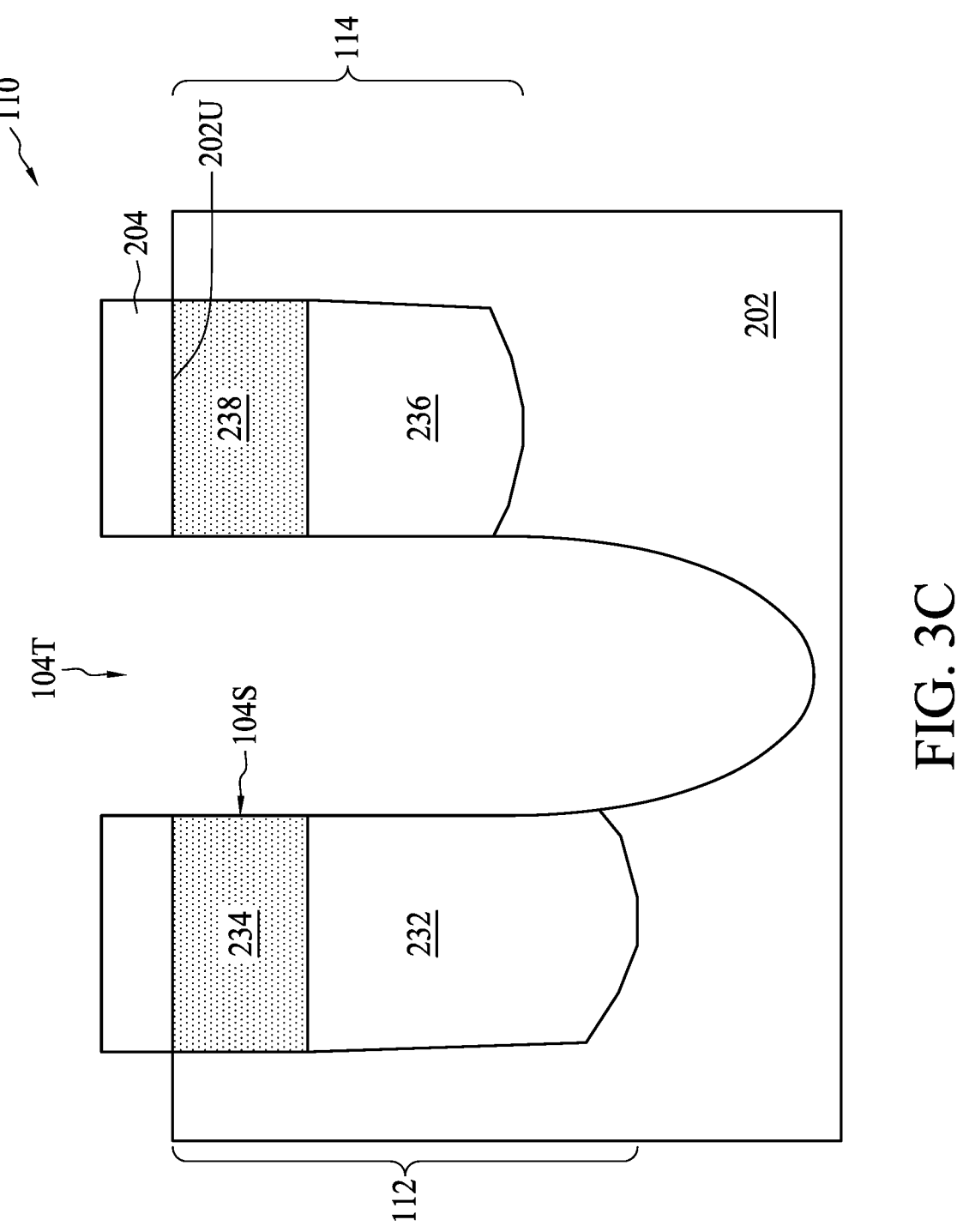
Figure 3D:
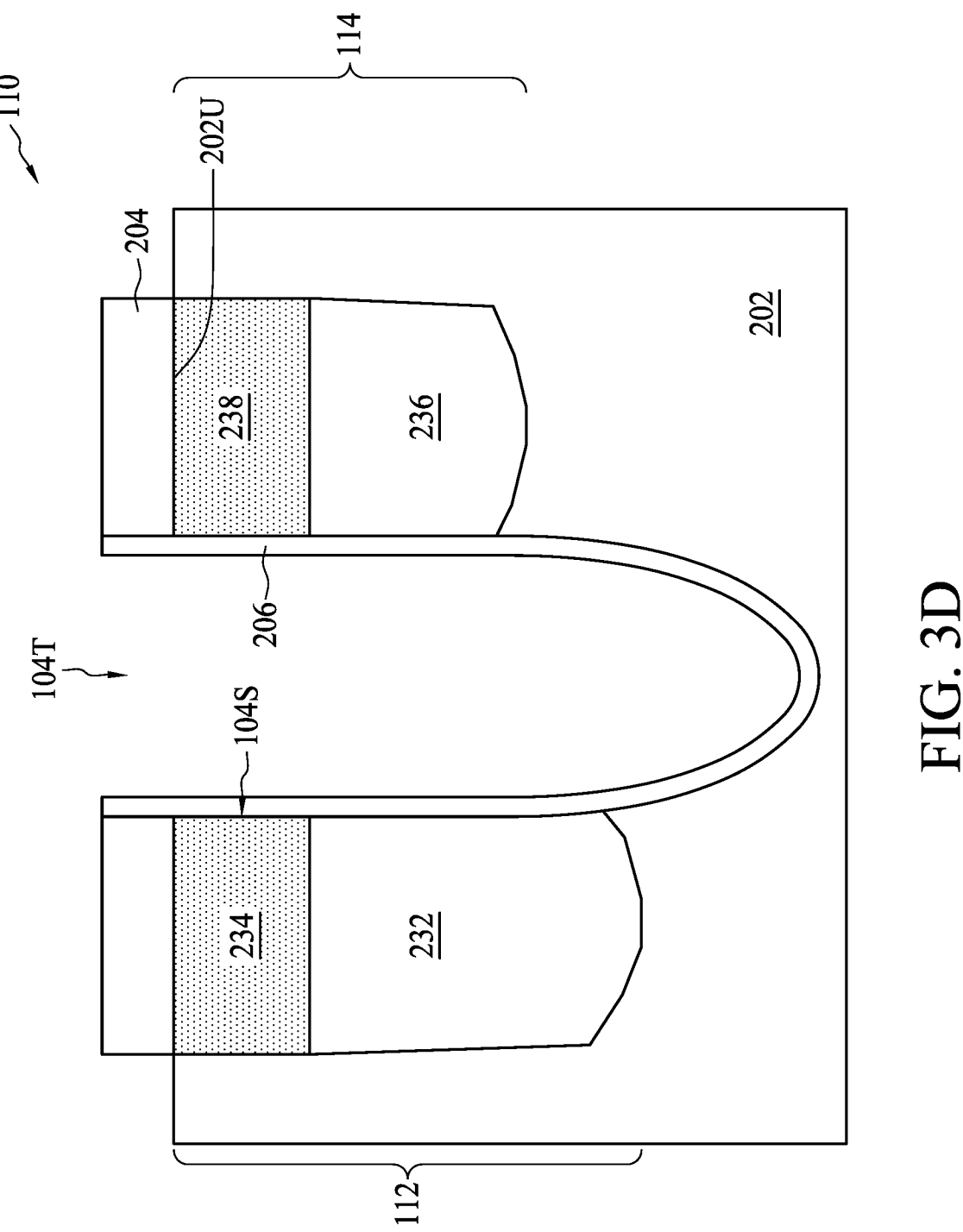
Figure 3E:
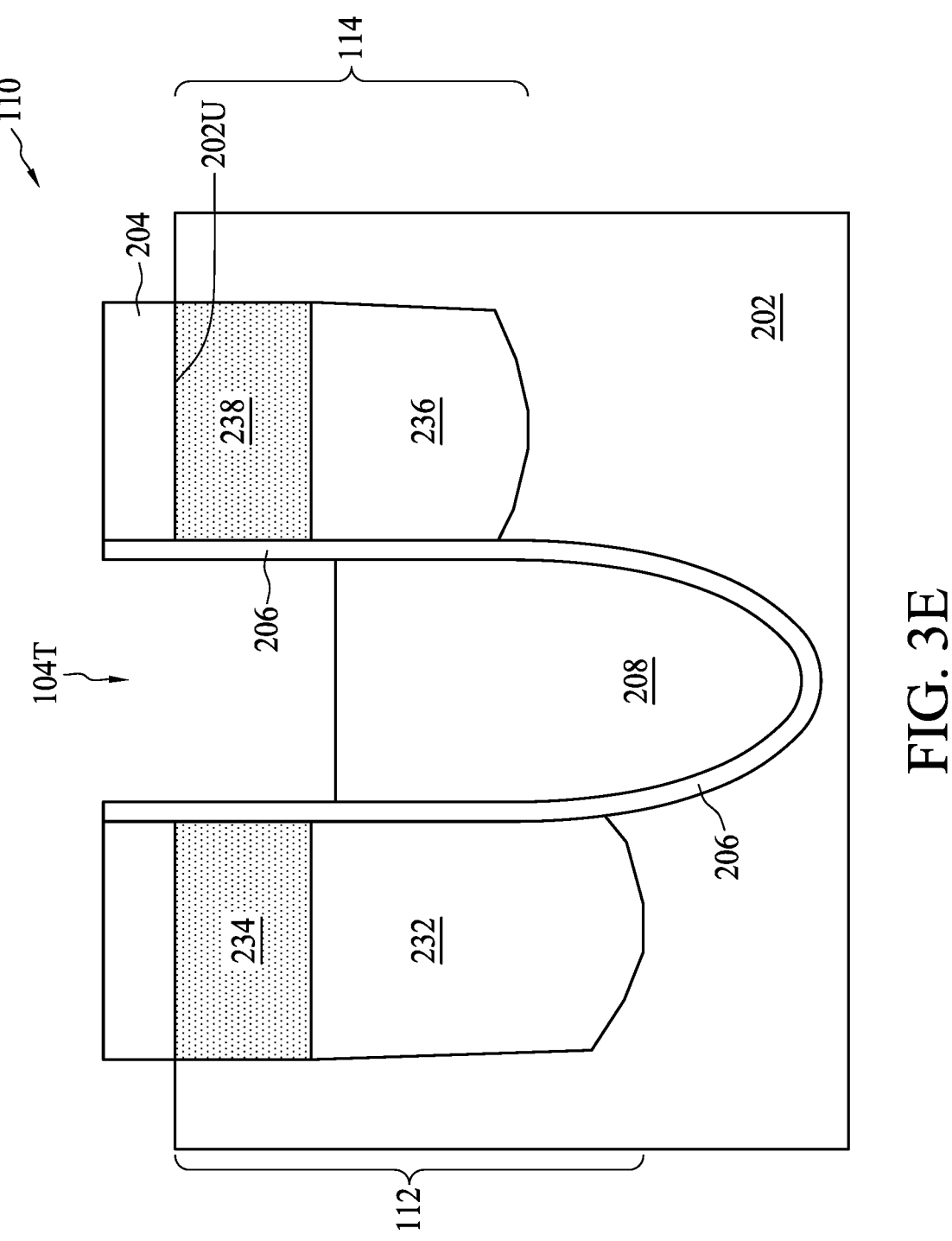
Figure 3F:
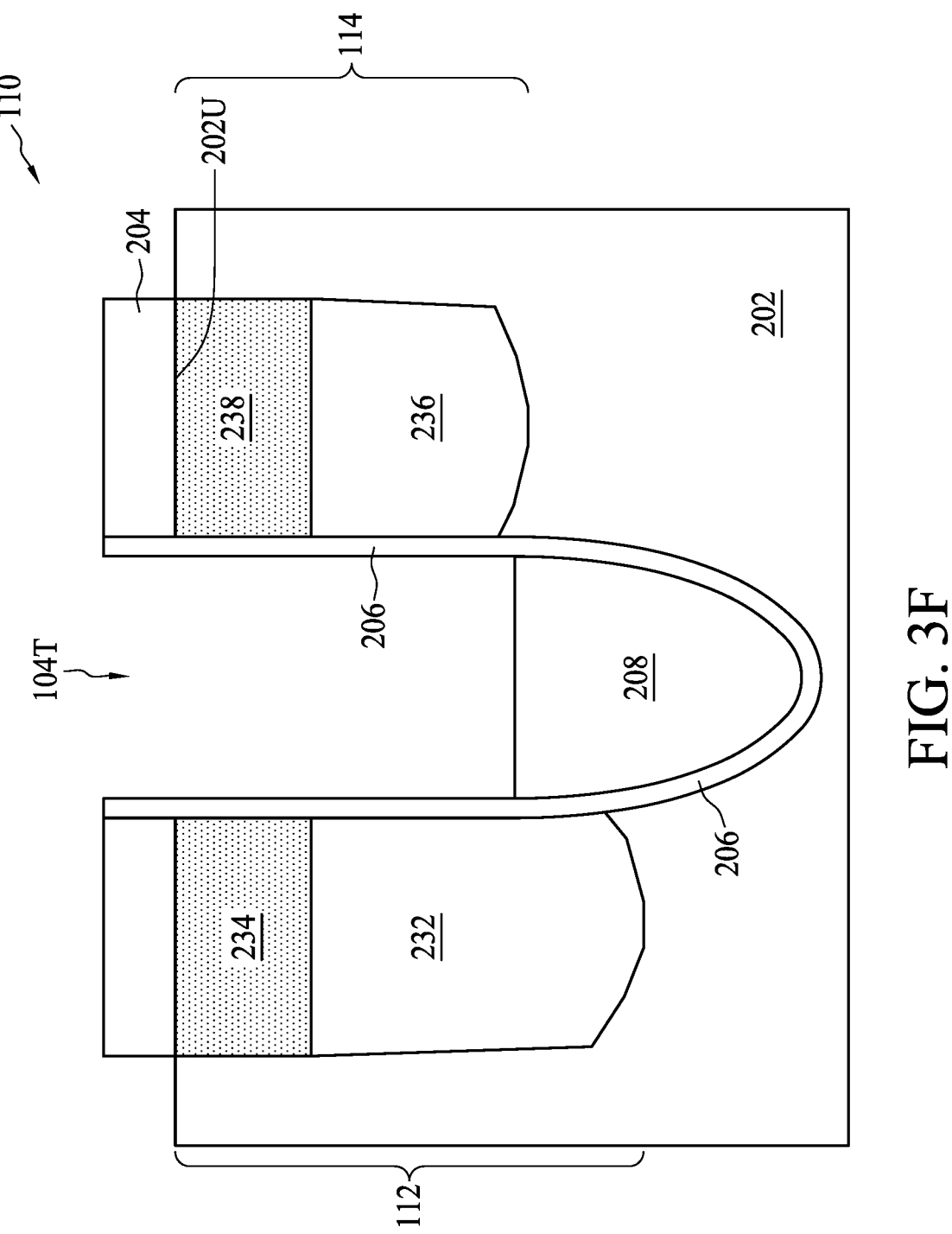
Figure 3G:
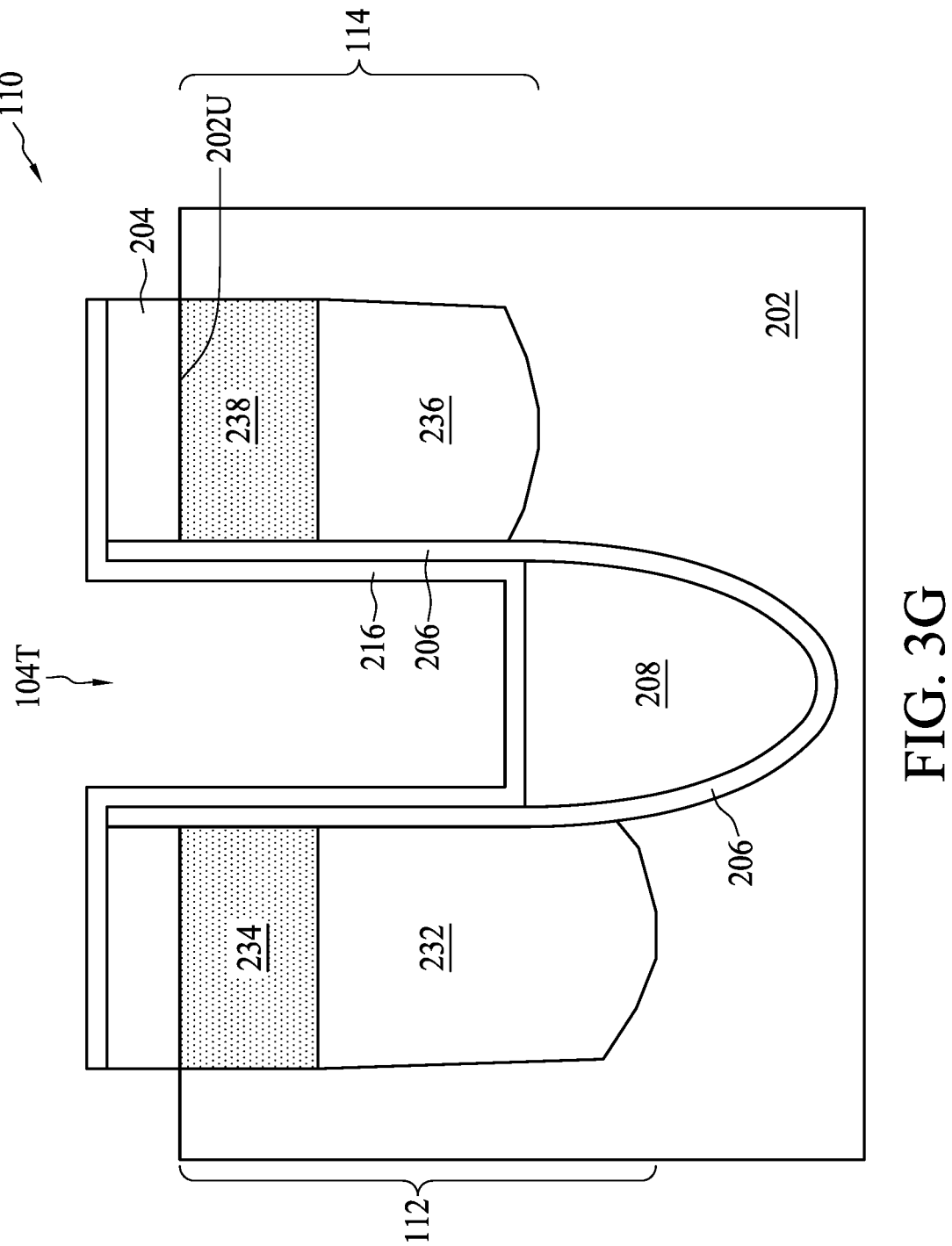
Figure 3H:
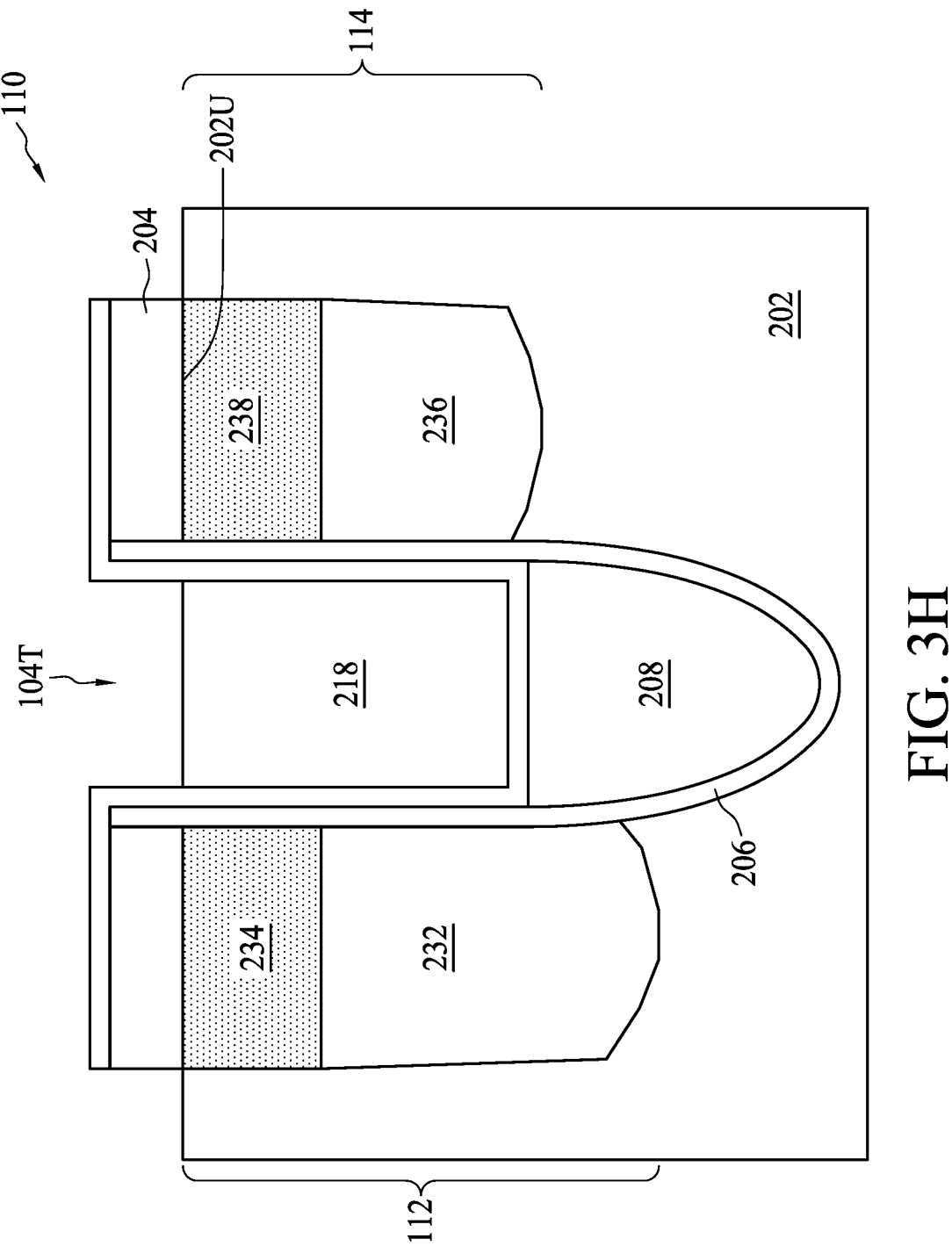
Figure 3I:
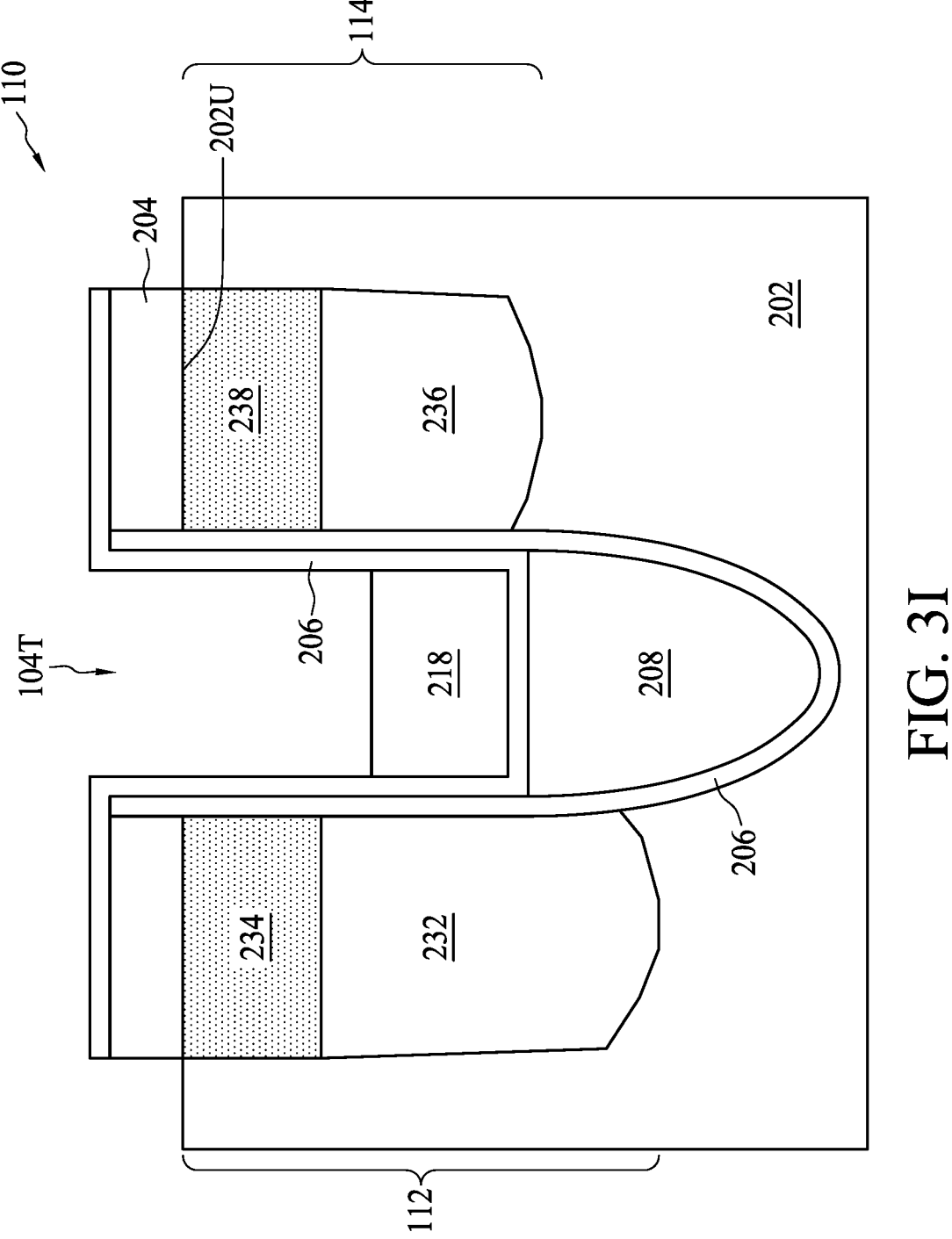
Figure 3J:
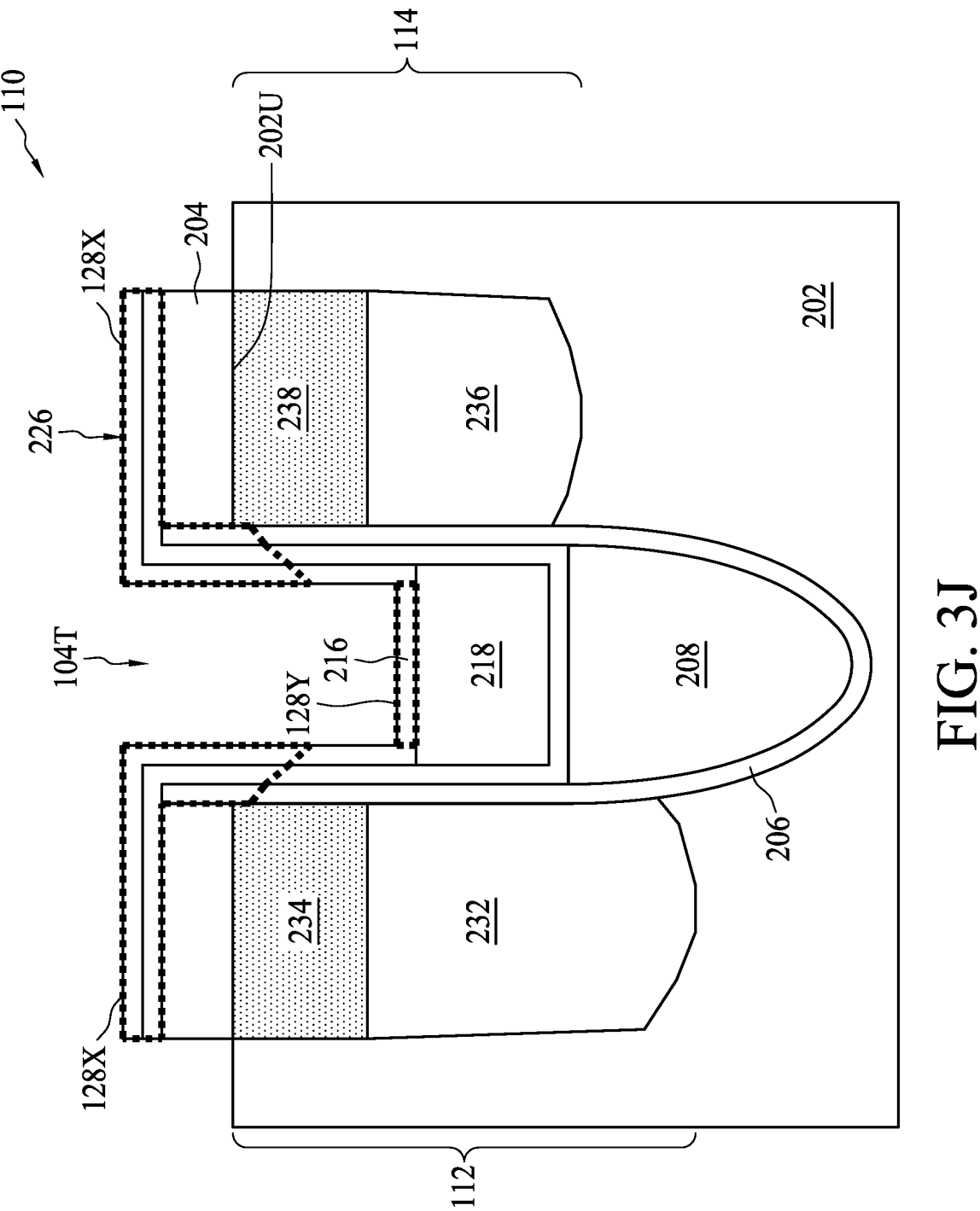
Figure 3K:
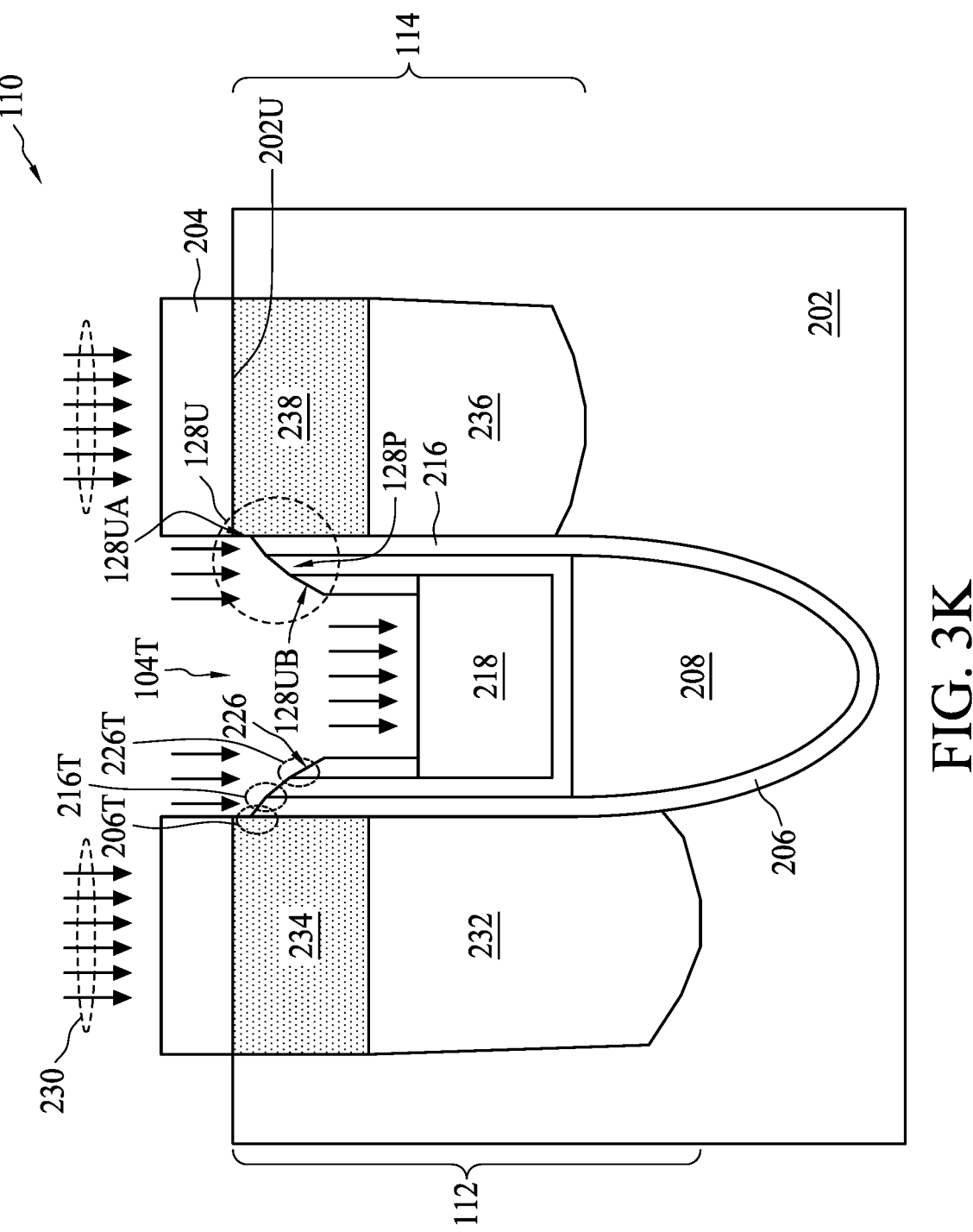
Figure 3L:
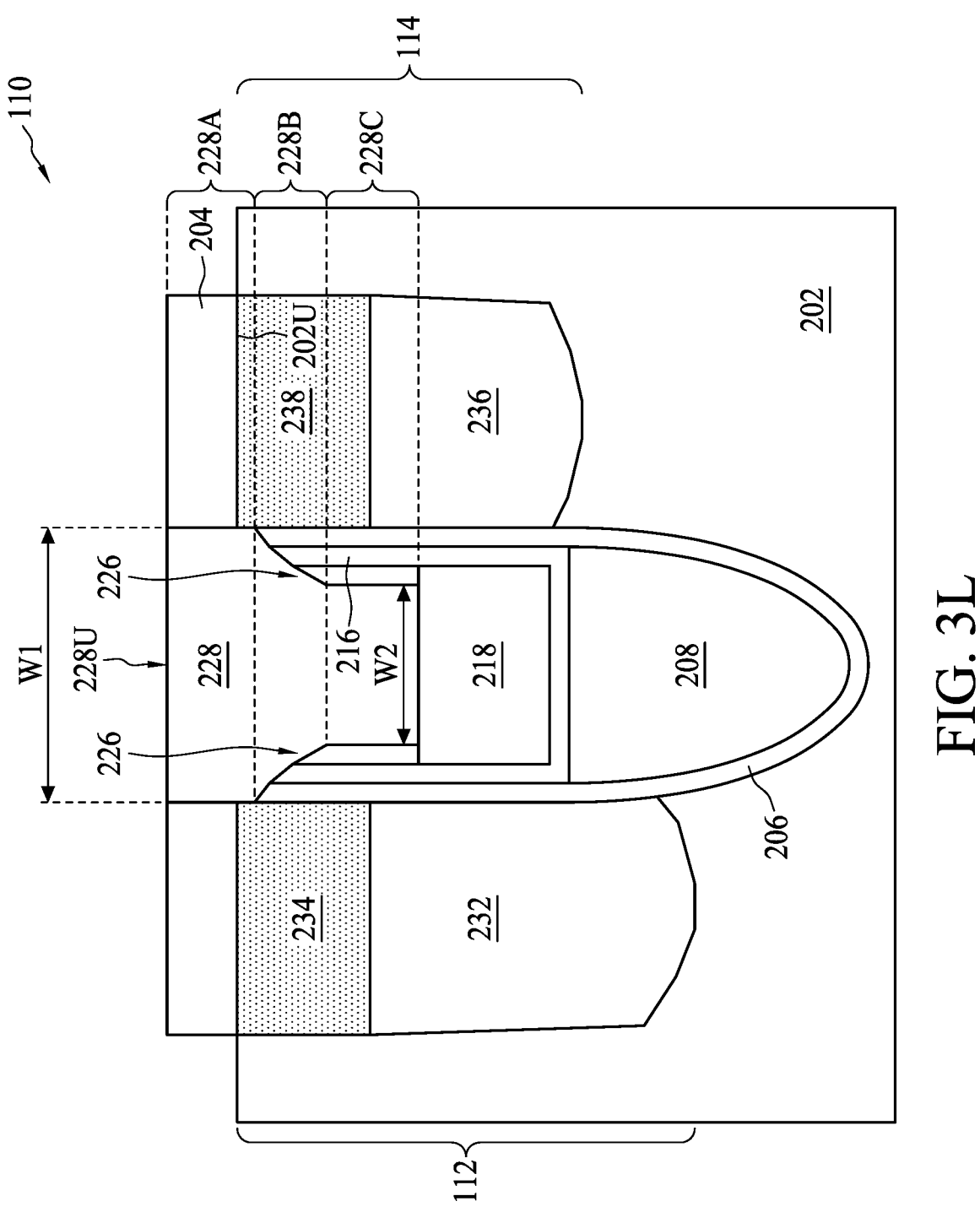
Figure 3M:
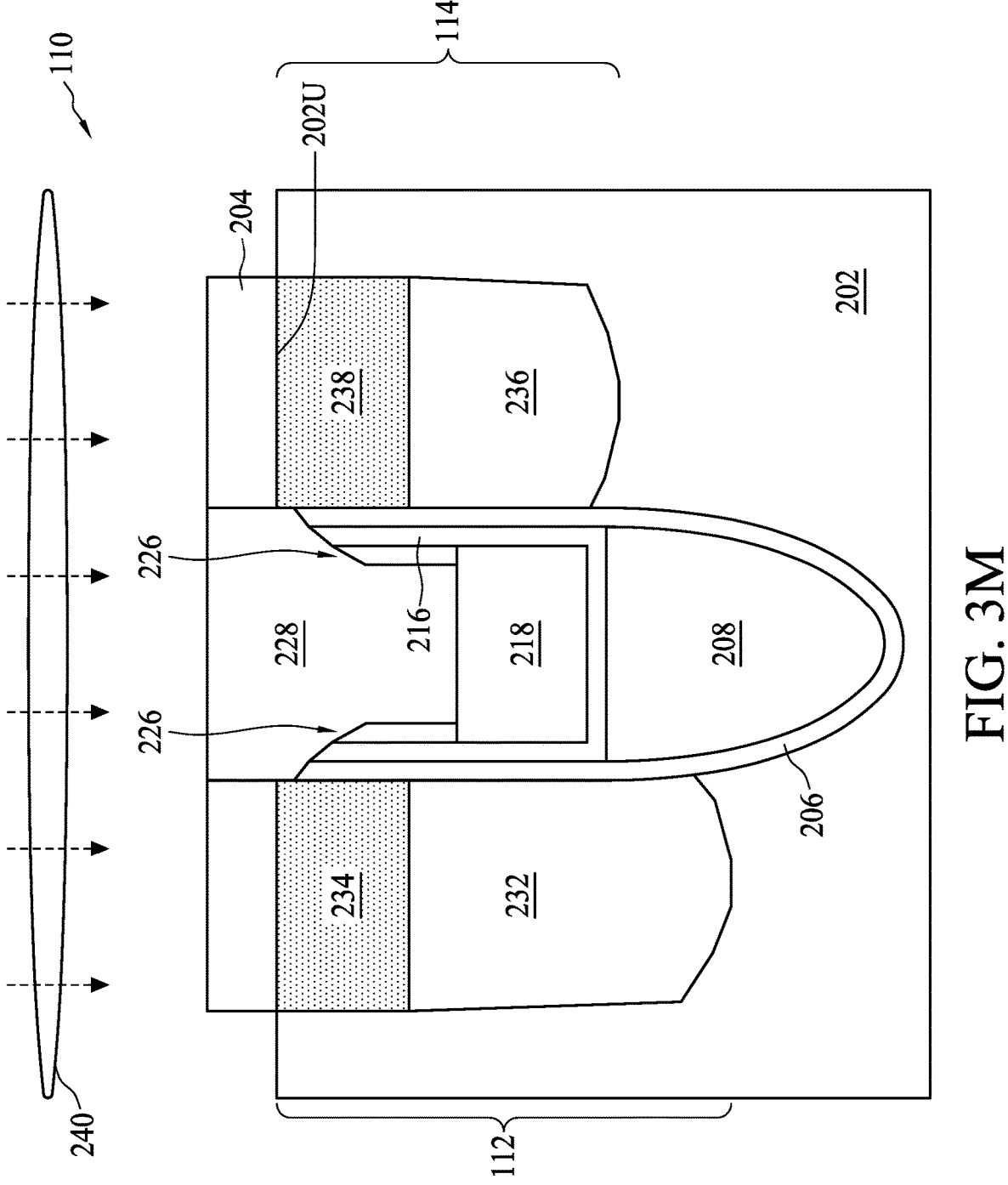
Figure 3N:
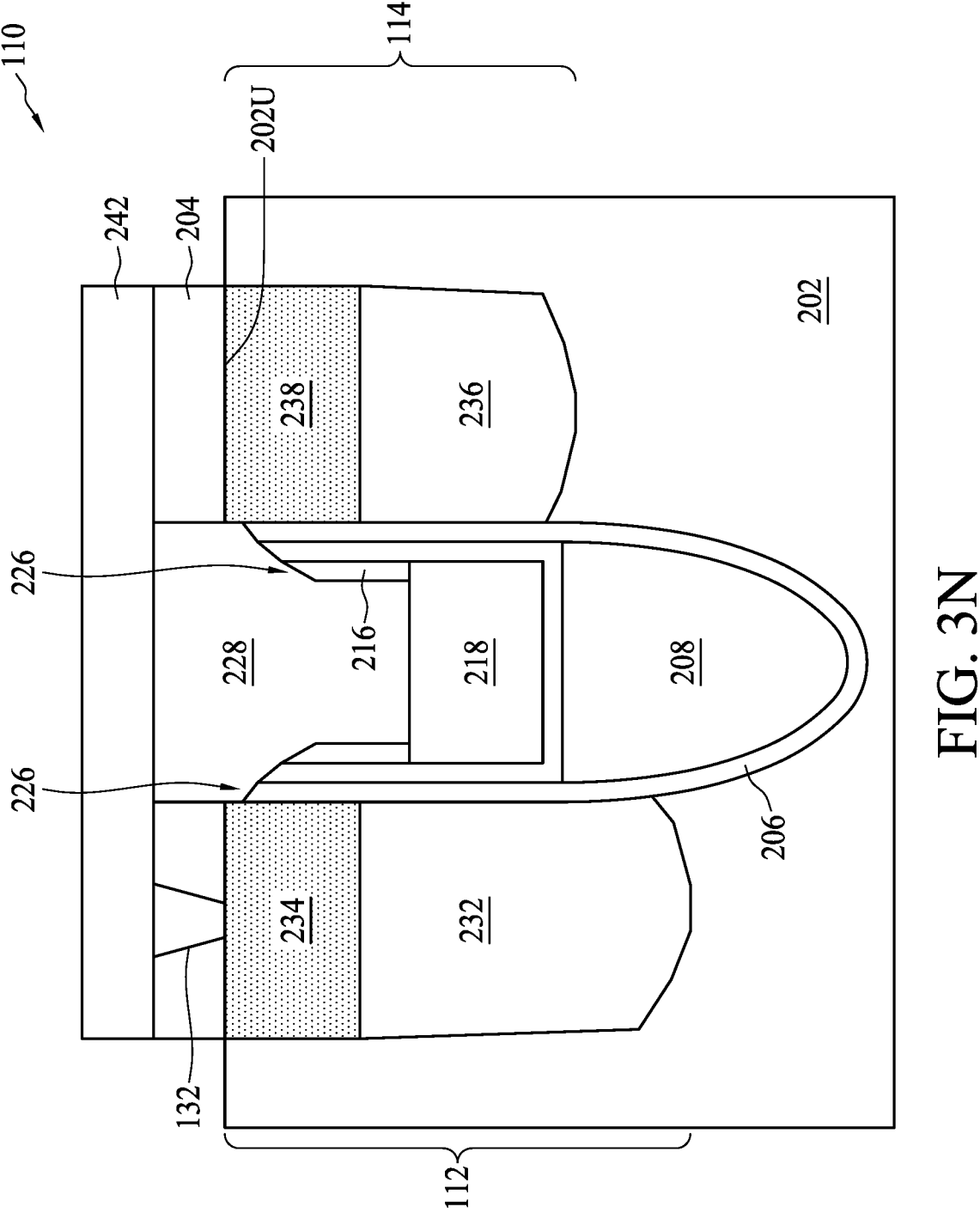

FIGS. 3A to 3N are schematic cross-sectional views of intermediate stages of a method 300 of forming a memory cell 100 shown in FIG. 2, in accordance with some embodiments of the present disclosure. It is understood that additional steps can be provided before, during, and after the steps shown by FIGS. 3A to 3N, and some of the steps described below can be replaced or eliminated, for additional embodiments of the method 300. The order of the steps may be interchangeable.

Referring to FIG. 3A, a substrate 202 is provided or received. The substrate 202 may be similar to the substrate 102 shown in FIG. 1B. According to some embodiments of the present disclosure, the substrates 202 includes a semiconductor material such as bulk silicon. According to some embodiments of the present disclosure, the substrate 202 includes other semiconductor materials, such as silicon germanium, silicon carbide, gallium arsenide, or the like.

According to some embodiments of the present disclosure, the substrate 202 is a p-type semiconductive substrate (acceptor type) or an n-type semiconductive substrate (donor type). Alternatively, the substrate 202 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. According to yet another embodiment of the present disclosure, the substrate 202 includes portions to form a semiconductor-on-insulator (SOI) substrate. In other alternatives, the substrate 202 may include a doped epitaxial layer, a gradient semiconductor layer, and/or a semiconductor layer overlaying another semiconductor layer of a different type, such as a silicon layer on a silicon germanium layer. According to some embodiments of the present disclosure, the substrate 202 is a hybrid substrate including first portions formed of a bulk silicon substrate and second portions formed of an SOI substrate.

According to some embodiments of the present disclosure, an isolation region 104 (not separately shown in FIG. 3A) is formed in the substrate 202. The isolation region 104 may be used to define the trenches 104 of the word lines 116 and the active regions 111, including the source/drain regions 112 and 114, of the memory cells 110. According to some embodiments of the present disclosure, the isolation region 104 is formed of a dielectric material, e.g., silicon nitride, silicon oxide, silicon oxynitride, or other suitable dielectric materials.

In an example process for forming the isolation region 104, an etching operation is performed to etch trenches on the substrate 202. The etching operation may be an anisotropic etching, and may include a dry etch, a wet etch, an RIE, or the like. Subsequently, a dielectric material is deposited in the trenches until the trenches are filled. According to some embodiments of the present disclosure, a planarization operation, e.g., mechanical grinding or chemical mechanical polishing (CMP) is utilized to remove excess materials of the isolation region 104 and level the upper surface of the isolation regions 104 with the upper surface 202U of the substrate 202.

Referring to FIG. 3A, a mask layer 204 is formed over the substrate 202. According to some embodiments of the present disclosure, the mask layer 204 is a dielectric layer and similar to the dielectric layer 130 or 140, or both, as shown in FIG. 2. According to some embodiments of the present disclosure, the mask layer 204 is formed of silicon nitride, silicon oxide, silicon oxynitride, silicon carbide, or other suitable dielectric materials. According to some embodiments of the present disclosure, the mask layer 204 is deposited over the substrate 202 using CVD, PVD, ALD, spin-on coating, or the like. According to some embodiments of the present disclosure, the mask layer 204 is patterned to include an opening exposing an area for the subsequently formed word line 116. The mask layer 204 is patterned using photolithography and etching operations. According to some embodiments of the present disclosure, the etching operation include a dry etch, a wet etch, an RIE, or the like. According to some embodiments of the present disclosure, the etching operation include an anisotropic etching operation.

A trench 104T is formed in the substrate 202. According to some embodiments of the present disclosure, an etching operation is performed on the substrate 202 with the mask layer 204 serving as the etching mask. Referring to FIG. 1A, since the trench 104T corresponds to the word line 116, the trench 104T includes a line shape extending across multiple adjacent active regions 111 from a top-view perspective. According to some embodiments of the present disclosure, the etching operation includes a dry etch, a wet etch, an RIE, or the like. According to some embodiments of the present disclosure, the etching operation include an anisotropic etching operation.

Referring to FIG. 3B, doped regions 112 and 114 are formed in the substrate 202 on two sides of the trench 104T. According to some embodiments of the present disclosure, the doped regions 112 and 114 includes a dopant type, e.g., N-type, different from that of the substrate 202. According to some embodiments of the present disclosure, the doped regions 112 and 114 serve as the source/drain regions of the transistor (control unit) of the respective memory cell 110. According to some embodiments of the present disclosure, the doped regions 112 and 114 are formed using one or more ion implantation operations.

According to an example forming process for the doped regions 112 and 114, a mask layer (not separately shown) is deposited over the substrate 202. The mask layer may be formed of a photoresist layer or a dielectric layer, e.g., a hard mask layer. The mask layer is patterned using photolithography and etching operations. According to some embodiments of the present disclosure, the etching operation include a dry etch, a wet etch, a combination thereof, e.g., reactive ion etch (RIE), or the like. The patterned mask layer defines the locations and areas of the doped regions 112 and 114. An ion implantation operation is performed to introduce dopants into the substrate 202 at a predetermined depth with a predetermined dopant concentration. According to some embodiments of the present disclosure, an annealing operation is performed after the ion implantation operations to activate the implanted dopants, to spread the dopants into a predetermined doped region profile, and to remove or fix some implantation-induced lattice damages in the substrate 202. According to some embodiments of the present disclosure, the mask layer is removed by stripping or etching after the ion implantation operations are completed.

According to some embodiments of the present disclosure, a lightly-doped-drain (LDD) region 232 or 236 of the doped region 112 or 114, respectively, is formed in a predetermine depth of the substrate 202. For example, the LDD regions 232 and 236 include a doping concentration in a range between about 1E12 and about 1E13 atoms/cm$^3$. According to some embodiments of the present disclosure, the LDD region 232 has a bottom deeper than a bottom of the LDD region 236. According to some embodiments of the present disclosure, the upper limit of the LDD regions 232 and 236 may be lower than the upper surface 202U through control of the power and dosage of the ion implantation operation.

Referring to FIG. 3C, heavily doped regions 234 and 238 are formed subsequently in the substrate 202 around the upper surface 202U of the substrate 202. According to some embodiments of the present disclosure, the heavily-doped region 234 or 238 has a doping concentration in a range about 1E14 and about 1E15 atoms/cm$^3$. According to some embodiments of the present disclosure, the heavily-doped regions 23 and 238 are used as contacts for the subsequently formed conductive vias and arranged to reduce contact resistance of the source/drain regions 112, 114.

According to some embodiments of the present disclosure, the trench 104T has a depth greater than the depths of the source/drain regions 112 or 114 to prevent the short channel effect. According to some embodiments of the present disclosure, the trench 104T exposes a sidewall of the source/drain region 112 or 114, e.g., sidewalls of the doped regions 232, 234, 236 and 238.

Referring to FIG. 1A and FIG. 3C, according to some embodiments of the present disclosure, the source/drain regions 112 and 114 may be doped to be closer to each other when the ion implantation operations are completed. According to some embodiments of the present disclosure, as shown in FIG. 1A, the source/drain regions 112 and 114 collectively form the active region 111 with an oval or ellipse shape from a top-view perspective, as defined by the isolation regions 104. According to some embodiments of the present disclosure, the source/drain regions 112 and 114 contact each other when the ion implantation operations are completed and will be separated by the subsequently-formed word lines 116.

Referring to FIG. 3D, a first dielectric layer 206 of the electrical insulating structure 128 is formed in the trench 104T and deposited on the sidewalls of the trench 104T. According to some embodiments of the present disclosure, the first dielectric layer 206 is deposited on the sidewalls of the trench 104T in a conformal manner with a substantially uniform thickness. According to some embodiments of the present disclosure, the first dielectric layer 206 includes silicon oxide and is formed using CVD, PVD, ALD, thermal oxidation, or the like. According to some embodiments of the present disclosure, a portion of the first dielectric layer 206 is formed on the upper surface of the mask layer 204. According to some embodiments of the present disclosure, an etching operation is performed to remove the portion of the first dielectric layer 206 from a location over the mask layer 204. According to some embodiments of the present disclosure, a portion of the first dielectric layer 206 on the sidewalls of the mask layer 204 is retained. According to some embodiments of the present disclosure, the first dielectric layer 206 is lined to the sidewalls of the doped regions 232, 234, 236 and 238.

Referring to FIG. 3E, the first gate electrode 208 is deposited in the trench 104T and on the bottom portion of the trench 104T over the first dielectric layer 206. According to some embodiments of the present disclosure, the first gate electrode 208 fills the bottom portion of the trench 104T. The first gate electrode 208 may be laterally surrounded by, or surrounded from two sides of, the lower portion of the first dielectric layer 206 adjacent to the first dielectric layer 206. According to some embodiments of the present disclosure, the first gate electrode 208 is formed of tungsten or titanium nitride. Alternatively, the first gate electrode 208 includes one of more metallic layers, e.g., copper, cooper alloy, tin, nickel, nickel alloy, aluminum, gold, silver, titanium, titanium nitride, tantalum, tantalum nitride, and the like. According to some embodiments of the present disclosure, the first gate electrode includes work function adjustment metals, such as TiAl, TiAlN, TiAlC, TaC, TaCN, TaSiN, TaAlC, Mn, Zr, a combination thereof, or the like.

Referring to FIG. 3F, the first gate electrode 208 is recessed to a predetermined thickness. The recessing of the first gate electrode 208 may include an etching operation, such as a dry etch, a wet etch, an RIE, or the like. After the recessing, the first gate electrode 208 includes a substantially flat upper surface. According to some embodiments of the present disclosure, the step of recessing the first gate electrode 208 is omitted from the method 300.

FIG. 3G illustrates the formation of the second dielectric layer 216 of the electrical insulating structure 128 in the trench 104T. According to some embodiments of the present disclosure, the second dielectric layer 216 includes a material similar to the first dielectric layer 206, e.g., silicon oxide.

According to some embodiments of the present disclosure, the second dielectric layer 216 is deposited on the sidewalls of the first dielectric layer 206 in a conformal manner with a substantially uniform thickness. The second dielectric layer 216 may be laterally surrounded by, or surrounded from two sides of, the middle portion of the first dielectric layer 216. According to some embodiments of the present disclosure, the second dielectric layer 216 covers the upper surface of the first gate electrode 208. According to some embodiments of the present disclosure, the second dielectric layer 216 is formed using CVD, PVD, ALD, or the like. According to some embodiments of the present disclosure, a portion of the second dielectric layer 216 is formed over the upper surface of the mask layer 204. According to some embodiments of the present disclosure, an etching operation is performed to remove the portion of the second dielectric layer 216 from a location over the mask layer 204. According to some embodiments of the present disclosure, the portion of the second dielectric layer 216 over the upper surface of the mask layer 204 is retained.

Referring to FIG. 3H, the second gate electrode 218 is deposited in the trench 104T and over the second dielectric layer 216. According to some embodiments of the present disclosure, the second gate electrode 218 has a work function different from that of the first gate electrode 208 to generate different electric fields around the word line 116 and the channel of the memory cell 110. Thus, the second gate electrode 218 is formed of a material different from that of the first gate electrode 208. According to some embodiments of the present disclosure, the second gate electrode 218 is formed of doped polysilicon. The second gate electrode 218 may be deposited using CVD, PVD, ALD, or other suitable deposition methods. According to some embodiments of the present disclosure, the bottom and sidewalls of the second gate electrode 218 are covered and flushed with the second dielectric layer 216. The second gate electrode 218 may be laterally surrounded by, or surrounded from two sides of, the lower portion of the second dielectric layer 216 adjacent to the first dielectric layer 206.

Referring to FIG. 3I, the second gate electrode 218 is recessed to a predetermined thickness. The recessing of the second gate electrode 218 may include an etching operation, such as a dry etch, a wet etch, an RIE, or the like. After the recessing, the second gate electrode 218 includes a substantially flat upper surface. According to some embodiments of the present disclosure, the step of recessing the second gate electrode 218 is omitted from the method 300.

FIG. 3J illustrates the formation of the third dielectric layer 226 of the electrical insulating structure 128 in the trench 104T. According to some embodiments of the present disclosure, the third dielectric layer 226 includes a material similar to the first dielectric layer 206 or the second dielectric layer 216, e.g., silicon oxide. According to some embodiments of the present disclosure, the third dielectric layer 226 is deposited on the sidewalls of the second dielectric layer 216 in a conformal manner with a substantially uniform thickness. The third dielectric layer 216 may be laterally surrounded by, or surrounded from two sides of, the upper portion of the second dielectric layer 216. According to some embodiments of the present disclosure, the third dielectric layer 226 covers the upper surface of the second gate electrode 218. According to some embodiments of the present disclosure, the third dielectric layer 226 is formed using CVD, PVD, ALD, or the like. According to some embodiments of the present disclosure, an etching operation is performed to remove the portion of the third dielectric layer 226 from a location over the mask layer 204. According to some embodiments of the present disclosure, the portion of the third dielectric layer 226 over the upper surface of the mask layer 204 is retained.

Referring to FIG. 3K, an etching operation 230 is performed to recess the upper portion 128U of the electrical insulating structure 128. According to some embodiments of the present disclosure, the etching operation 230 is an anisotropic etching operation to remove the horizontal portions of the electrical insulating structure 128. The anisotropic etching may include a dry etching. After the etching operation 230, horizontal portions of the electrical insulating structure 128 over the mask layer 204 (e.g., horizontal parts of the portion 128X of the first, second and third dielectric layers 206, 216, 226 shown in FIG. 3J) and the horizontal portion covering the upper surface of the second gate electrode 218 (e.g., the portion 128Y of third dielectric layer 226 shown in FIG. 3J) are removed. Further, the vertical portions 128X of the electrical insulating structure 128 on the sidewalls of the mask layer 204 (e.g., vertical parts of the portion 128X shown in FIG. 3J) are also removed. As a result, the top portion 128U of the electrical insulating structure 128 is lower than the upper surface 202U of the substrate 202 through the etching operation 230. In other words, each of the top portions 206T, 216T and 226T of the first dielectric layer 206, the second dielectric layer 216 and the third dielectric layer 226, respectively, is recessed from the upper surface 202U of the substrate 202.

According to some embodiments of the present disclosure, the third dielectric layer 226 has a top portion 226T lower than the top portion 216T of the second dielectric layer 216, while the second dielectric layer 216 has a top portion 216T lower than the top portion 206T of the first dielectric layer 206. In some embodiments, the upper surface of the electrical insulating structure 128 has a slope 128P extending from a location around the upper surface 202U of the substrate 202 to a location directly over the second gate electrode 218. According to some embodiments of the present disclosure, the slope 128P is in a substantially straight line shape. According to some embodiments of the present disclosure, the slope 128P is in a substantially curved shape.

FIG. 3L illustrates the formation of the capping layer 228 in the trench 104T. According to some embodiments of the present disclosure, the capping layer 228 includes a dielectric material, e.g., silicon nitride, different from that of the first dielectric layer 206, the second dielectric layer 216 or the third dielectric layer 226. According to some embodiments of the present disclosure, the capping layer 228 includes a dielectric material similar to the mask layer 204. According to some embodiments of the present disclosure, the capping layer contacts the sidewalls of the mask layer 204. According to some embodiments of the present disclosure, the capping layer 228 contacts the upper surface of the second gate electrode 218. According to some embodiments of the present disclosure, the capping layer 228 is formed using CVD, PVD, ALD, or the like. According to some embodiments of the present disclosure, a planarization operation is performed to remove the excess material of the capping layer 228 over the mask layer 204 and level the upper surface 228U with the upper surface of the mask layer 204.

In some embodiments, the capping layer 228 includes an upper portion 228A, a middle portion 228B and a lower portion 228C. According to some embodiments of the present disclosure, the upper portion 228A has a substantially uniform width W1 from a cross-sectional view. According to some embodiments of the present disclosure, the lower portion 228C has a substantially uniform width W2 from a cross-sectional view. According to some embodiments of the present disclosure, the middle portion 228B tapers from a first location 228UA around a top portion of the first dielectric layer 206 to a second location 228UB directly above the second gate electrode 218 from a cross-sectional view. According to some embodiments of the present disclosure, the middle portion 228B at least partially covers the top portions 206T, 216T and 226T of the first dielectric layer 206, the second dielectric layer 216 and the third dielectric layer 226, respectively. According to some embodiments of the present disclosure, the capping layer 228 covers the entirety of the electrical insulating structure 128 vertically.

Referring to FIG. 3M, a cleaning operation 240 is performed on the memory cell 110. The cleaning operation 240 may be performed using an etchant including diluted HF (DHF). According to some embodiments of the present disclosure, the cleaning operation 240 can aid in removing particles or debris not cleared in the previous operations, e.g., a lithography operation. According to some embodiments of the present disclosure, the etchant or chemistry used in the cleaning operation 240 is selective to the first dielectric layer 206, the second dielectric layer 216 or the third dielectric layer 226 of the electrical insulating structure 128 with respect to the capping layer 228 or the mask layer 204. Since the electrical insulating structure 128 is fully covered by the capping layer 228, the chemistry of the cleaning operation 240 almost does not consume the capping layer 228 or the mask layer 204. Accordingly, the electrical insulating structure 128 is protected by the capping layer 228 from the etchant of the cleaning operation 240. The device reliability of the memory cell 110 can thus be improved through the cleaning operation 240.

Referring to FIG. 3N, a conductive via 132 is deposited in the mask layer 204 to be electrically coupled to the doped region 234. In some embodiments, an opening is etched through the mask layer 204 to expose an upper surface of the doped region 234. A conductive material is deposited in the opening to form the conductive via. The conductive material may include a doped silicon or a metallic material.

A conductive line 242 is deposited over the mask layer 204 and the capping layer 228 to be electrically coupled to the conductive via 132. The conductive line 242 may be formed of a conductive material, e.g., copper, aluminum, tungsten, titanium, titanium nitride, tantalum, tantalum nitride, or the like. The conductive line 242 may be formed using CVD, PVD, ALD, plating, or other suitable deposition operations.

Figure 4A:
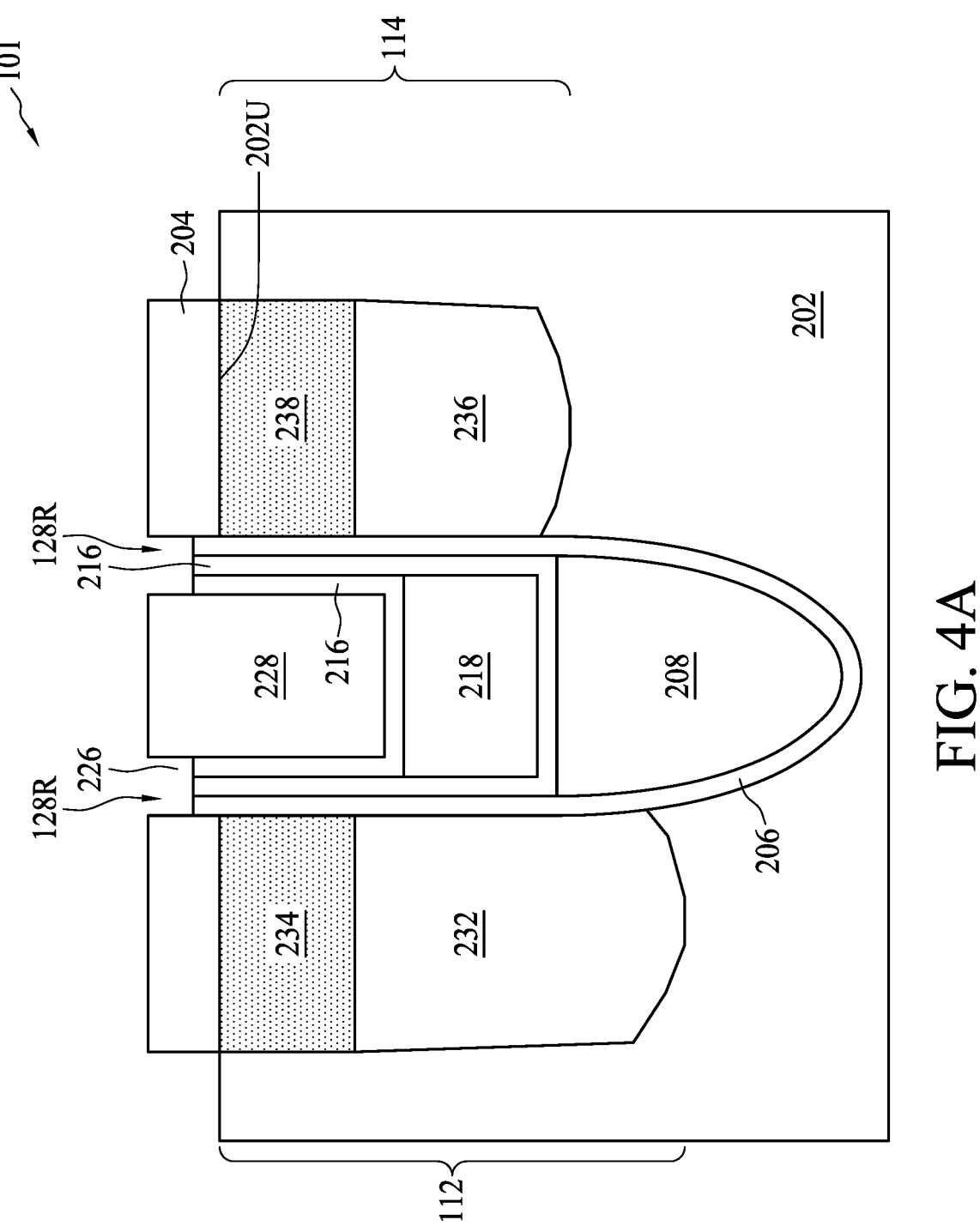
FIGS. 4A and 4B are schematic cross-sectional views of intermediate stages of a method of forming a memory cell, in accordance with some comparative embodiments of the present disclosure.
Figure 4B:
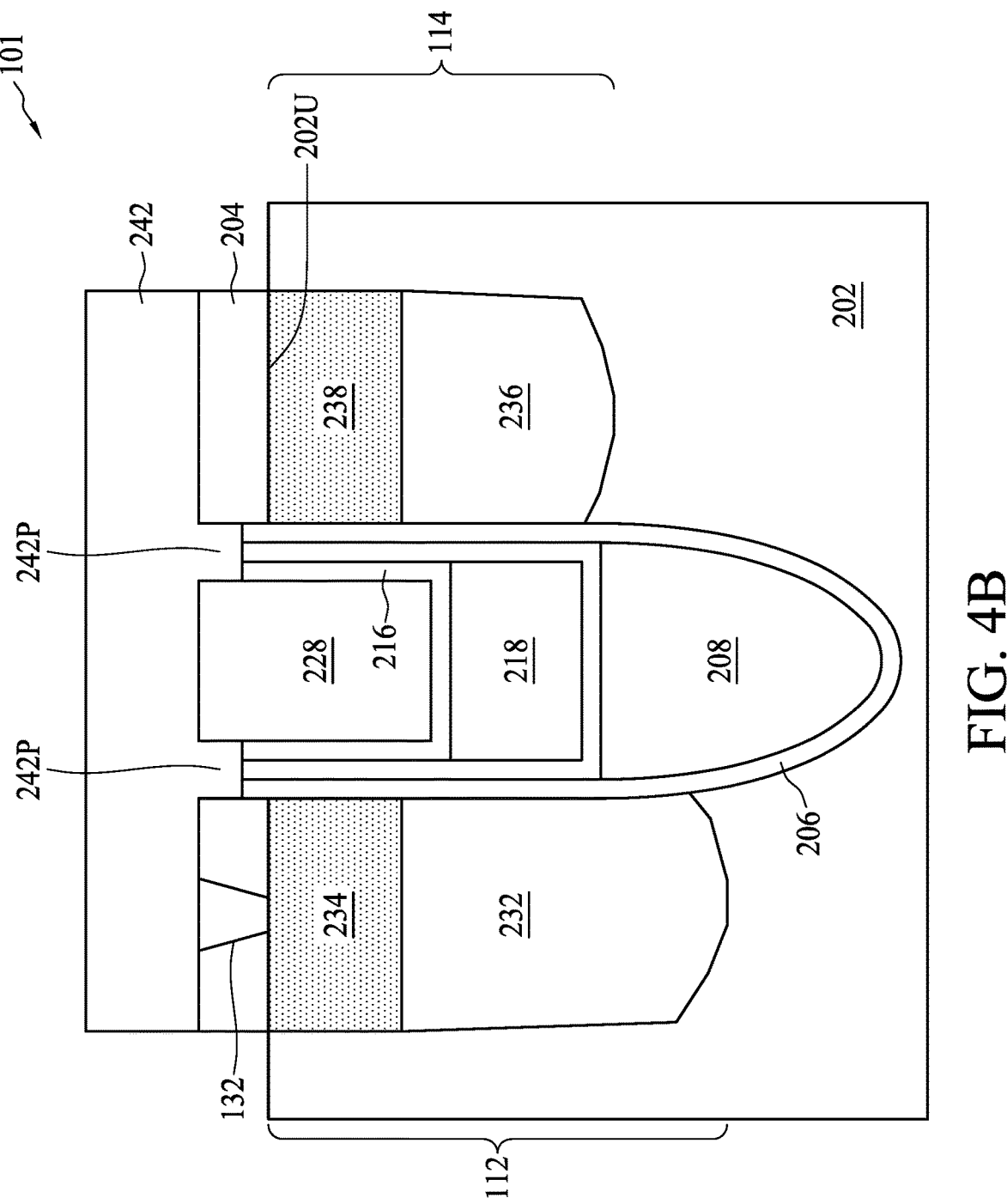
Figure 4C:
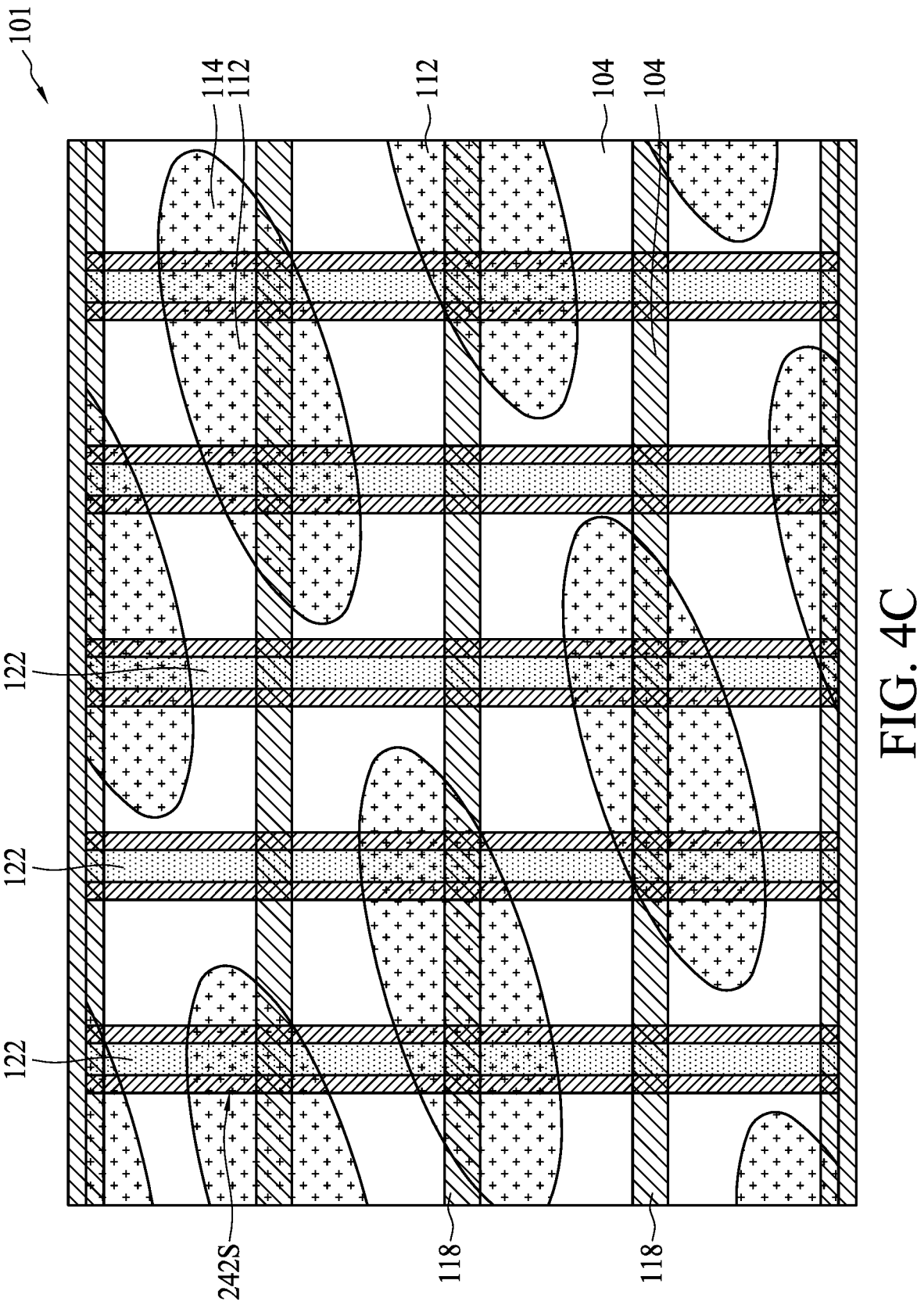
FIG. 4C is a schematic top view of an intermediate stage of a method of forming a memory device, in accordance with some comparative embodiments of the present disclosure.

FIGS. 4A to 4C are schematic cross-sectional views and a top view, respectively, of intermediate stages of a method 400 of forming a memory cell 101 in accordance with some comparative embodiments of the present disclosure. The method 400 is similar to the method 300 for forming the memory cells 110 in many aspects, and these similar descriptions are omitted herein for brevity. The method 400 for forming the memory cells 101 differs from the method 300 for forming the proposed memory cells 110 mainly in that the recessing operation described with reference to FIG. 3K is omitted from the method 400. Referring to FIG. 4A, the method 400 proceeds with the step of performing a deposition operations of the capping layer 228 with reference to FIG. 3L immediately following the deposition of the third dielectric layer 226 with reference to FIG. 3J. A cleaning operation similar to the cleaning operation 240 performed with reference to FIG. 3M. Since the electrical insulating structure 128 is not recessed to be below the upper surface 202U of the substrate prior to the deposition of the capping layer 228, the etchant of the cleaning operation is selective to the dielectric material, for example, silicon oxide, of the electrical insulating structure 128. As a result, one or more recesses 128R of the electrical insulating structure 128 are formed on the surface thereof. According to some embodiments, the recess 128R has an elongate shape along two sides of the word line 116 from a top-view perspective (see FIG. 4C).

Referring to FIGS. 4B and 4C, the conductive line 242 is deposited over the mask layer 204, the electrical insulating structure 128 and the capping layer 228. The material, configuration and method of forming for the conductive line 242 are similar to those for forming the conductive line described with reference to FIG. 3N. Through the formation of the conductive line 242, the recesses 128R are also filled with the conductive materials of the conductive line 242.

Referring to FIGS. 3C and 4C, since the word lines 116 (and the corresponding trenches 104T) are formed extending across adjacent active regions 111 from the top-view perspective, the electrical insulating structure 128 also extends across adjacent active regions 111. Further, the recesses 128R, which are arranged aligned with the electrical insulating structure 128 vertically, also extends across the adjacent active regions 111. As a result, the subsequently-formed conductive line 242 generates undesired bit line stringers 242P electrically connecting the adjacent active regions 111. That will cause short circuit between the adjacent memory cells 101, and the reliability of the memory cells 101 will be degraded.

In contrast, as illustrated with reference to FIGS. 2 and 3K, the proposed recessed electrical insulating structure 128 is recessed before the formation of the capping layer 228. Therefore, the potential etching of the electrical insulating structure 128 by the cleaning chemistry of the subsequent cleaning operation 240 will be prevented by the capping layer 228. The electrical insulating structure 128 will not be damaged during the cleaning operation 240. The device performance and reliability can be maintained.

FIGS. 5A and 5B show a schematic flowchart of a method 500 of manufacturing a memory cell, in accordance with some embodiments of the present disclosure. It is understood that additional steps can be provided before, during, and after the steps shown by FIGS. 5A and 5B, and some of the steps described below can be replaced or eliminated, for additional embodiments of the method 500. The order of the steps may be interchangeable.

At step S502, a substrate including an upper surface is provided. At step S504, source/drain regions are formed in the substrate. At step S506, a trench is etched in the substrate.

At step S508, a first dielectric layer is deposited in the trench. At step S510, a first gate electrode is deposited in the trench and laterally surrounded by, or surrounded from two sides of, the first dielectric layer. At step S512, a thickness of the first gate electrode is removed. In some embodiments, step S512 is omitted from the method 500.

At step S514, a second dielectric layer is deposited in the trench over the first gate electrode and on sidewalls of the first dielectric layer.

At step S516, a second gate electrode is deposited in the trench and laterally surrounded by, or surrounded from two sides of, the first and second dielectric layers. At step S518, a thickness of the second gate electrode is removed. In some embodiments, step S518 is omitted from the method 500.

At step S520, a third dielectric layer is deposited in the trench over the second gate electrode and on sidewalls of the second dielectric layer. At step S522, an etching operation is performed to remove top portions of the first, the second and the third dielectric layers.

At step S524, a capping layer is performed to fill the trench. At step S526, a cleaning operation is performed on the memory cell. At step S528, a conductive line is deposited over the capping layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a memory device, comprising:
   providing a substrate including an upper surface;
   performing a first etching operation to form a trench in the substrate;
   depositing a first dielectric layer in the trench;
   forming a first gate electrode in the trench and laterally surrounded by the first dielectric layer;
   depositing a second dielectric layer in the trench over the first gate electrode and on sidewalls of the first dielectric layer;
   performing a second etching operation to remove top portions of the first and second dielectric layers; and
   depositing a capping layer to fill the trench.

2. The method of claim 1, wherein the second etching operation comprises an anisotropic etching operation.

3. The method of claim 2, wherein the anisotropic etching operation includes a dry etching operation.

4. The method of claim 1, further comprising depositing a second gate electrode in the trench and laterally surrounded by the second dielectric layer.

5. The method of claim 4, wherein the first gate electrode and the second gate electrode are formed of different materials.

6. The method of claim 4, further comprising removing a thickness of the second gate electrode.

7. The method of claim 4, further comprising depositing a third dielectric layer in the trench and over the second gate electrode.

8. The method of claim 7, wherein the second etching operation further removes a portion of the third dielectric layer covering the second gate electrode.

9. The method of claim 7, wherein the second etching operation forms a slope on the second and the third dielectric layers and causes a top portion of the third dielectric layer to be lower than a top portion of the second dielectric layer.

10. The method of claim 9, wherein the second etching operation causes the slope to extend to the first dielectric layer and causes the top portion of the second dielectric layer to be lower than a top portion of the first dielectric layer.

11. The method of claim 1, wherein the second etching operation causes the top portions of the first and second dielectric layers to be lower than the upper surface of the substrate.

12. The method of claim 1, wherein the depositing of the first dielectric layer and the second dielectric layer comprises depositing the first and second dielectric layers in a conformal manner along a sidewall of the trench.

13. The method of claim 1, wherein the capping layer includes:

a middle portion tapering from a first location around a top portion of the first dielectric layer after the second etching operation to a second location directly over the second dielectric layer, and a lower portion below the middle portion, wherein the lower portion has a substantially uniform width.

14. The method of claim 1, further comprising forming source/drain regions in the substrate prior to the first etching operation.

15. The method of claim 1, wherein the first and second dielectric layers are formed of a material different from the capping layer.

\* \* \* \* \*